(12) United States Patent
Abatchev et al.

(10) Patent No.: US 7,687,408 B2
(45) Date of Patent: Mar. 30, 2010

(54) METHOD FOR INTEGRATED CIRCUIT FABRICATION USING PITCH MULTIPLICATION

(75) Inventors: Mirzafer K. Abatchev, Boise, ID (US); Gurtej Sandhu, Boise, ID (US); Luan Tran, Meridian, ID (US); William T. Rericha, Boise, ID (US); D. Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 307 days.

(21) Appl. No.: 11/683,518

(22) Filed: Mar. 8, 2007

(65) Prior Publication Data
US 2007/0148984 A1 Jun. 28, 2007

Related U.S. Application Data

(62) Division of application No. 11/492,323, filed on Jul. 24, 2006, which is a division of application No. 10/934,778, filed on Sep. 2, 2004, now Pat. No. 7,115,525.

(51) Int. Cl.
*H01L 21/302* (2006.01)
*H01L 21/461* (2006.01)

(52) U.S. Cl. ............... 438/751; 438/736; 438/950; 257/E21.039; 257/E21.033

(58) Field of Classification Search ........... 438/751, 438/736, 945, 947, 950; 257/E21.033, E21.024, 257/E21.035, E21.038, E21.039
See application file for complete search history.

(56) References Cited

U.S. PATENT DOCUMENTS 4,234,362 A 11/1980 Riseman (Continued)

FOREIGN PATENT DOCUMENTS

DE 280851 7/1990

DE 42 36 609 A1 5/1994

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Caridad M Everhart
(74) *Attorney, Agent, or Firm*—Knobbe, Martens, Olson & Bear LLP

(57) ABSTRACT

Different sized features in the array and in the periphery of an integrated circuit are patterned on a substrate in a single step. In particular, a mixed pattern, combining two separately formed patterns, is formed on a single mask layer and then transferred to the underlying substrate. The first of the separately formed patterns is formed by pitch multiplication and the second of the separately formed patterns is formed by conventional photolithography. The first of the separately formed patterns includes lines that are below the resolution of the photolithographic process used to form the second of the separately formed patterns. These lines are made by forming a pattern on photoresist and then etching that pattern into an amorphous carbon layer. Sidewall pacers having widths less than the widths of the un-etched parts of the amorphous carbon are formed on the sidewalls of the amorphous carbon. The amorphous carbon is then removed, leaving behind the sidewall spacers as a mask pattern. Thus, the spacers form a mask having feature sizes less than the resolution of the photolithography process used to form the pattern on the photoresist. A protective material is deposited around the spacers. The spacers are further protected using a hard mask and then photoresist is formed and patterned over the hard mask. The photoresist pattern is transferred through the hard mask to the protective material. The pattern made out by the spacers and the temporary material is then transferred to an underlying amorphous carbon hard mask layer. The pattern, having features of difference sizes, is then transferred to the underlying substrate.

33 Claims, 23 Drawing Sheets

U.S. PATENT DOCUMENTS

| | | | |
|---|---|---|---|
| 4,419,809 A | 12/1983 | Riseman et al. |
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,716,131 A | 12/1987 | Okazawa et al. |
| 4,776,922 A | 10/1988 | Bhattacharyya et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,924,191 B2 | 8/2005 | Liu et al. |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,183,205 B2 * | 2/2007 | Hong ........................ 438/671 |
| 7,183,597 B2 | 2/2007 | Doyle |
| 7,208,379 B2 | 4/2007 | Venugopal et al. |
| 7,288,445 B2 | 10/2007 | Bryant et al. |
| 7,291,560 B2 | 11/2007 | Parascandola et al. |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 * | 8/2005 | Liu et al. ........................ 216/41 |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0234138 A1 | 10/2006 | Fehlhaber et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |

| | | | |
|---|---|---|---|
| 2007/0210449 | A1 | 9/2007 | Caspary et al. |
| 2007/0215874 | A1 | 9/2007 | Furukawa et al. |
| 2007/0215960 | A1 | 9/2007 | Zhu et al. |
| 2007/0275309 | A1 | 11/2007 | Liu |
| 2008/0054350 | A1 | 3/2008 | Breitwisch et al. |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| KR | 1999-0001440 | 1/1999 |
| KR | 1999-027887 | 4/1999 |
| WO | WO 94/15261 | 7/1994 |
| WO | WO 02/099864 A1 | 12/2002 |
| WO | WO 04/001799 A2 | 12/2003 |
| WO | WO 2004/003977 A2 | 1/2004 |
| WO | WO 2005/010973 | 2/2005 |
| WO | WO 2005/034215 A1 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515, filed Oct. 24, 2006, Micron Ref. No. 2005-1173.00/US."

Ex Parte Cantell, unpublished decision of the Board of Patent Appeals and Interferences, Mar. 4, 2005.

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

U.S. Office Action issued May 15, 2008 in U.S. Appl. No. 11/492,513, filed Jul. 24, 2006.

U.S. Office Action issued Jun. 3, 2008 in U.S. Appl. No. 11/492,323, filed Jul. 24, 2006.

Choi et al., "Sublithographic nanofabrication technology for nanocatalysts and DNA chips," *J.Vac. Sci. Technol.*, pp. 2951-2955 (Nov./Dec. 2003).

U.S. Office Action issued Aug. 18, 2009 in U.S. Appl. No. 11/670,296.

* cited by examiner

METHOD FOR INTEGRATED CIRCUIT FABRICATION USING PITCH MULTIPLICATION

PRIORITY CLAIM

This application is a divisional of U.S. patent application Ser. No. 11/492,323, filed Jul. 24, 2006, which is a divisional of U.S. patent application Ser. No. 10/934,778, filed Sep. 2, 2004 (now U.S. Pat. No. 7,115,525, issued Oct. 3, 2006).

REFERENCE TO RELATED APPLICATIONS

This application is also related to the following: U.S. patent application Ser. No. 10/931,772 to Abatchev et al., filed Aug. 31, 2004, entitled Critical Dimension Control; U.S. patent application Ser. No. 10/932,993 to Abatchev et al., filed Sep. 1, 2004, entitled Mask Material Conversion; U.S. patent application Ser. No. 10/931,771 to Tran et al., filed Aug. 31, 2004, entitled Methods for Increasing Photo-Alignment Margins; and U.S. patent application Ser. No. 10/934,317 to Sandhu et al., filed Sep. 2, 2004, entitled Methods to Align Mask Patterns.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency in modern electronics, integrated circuits are continuously being reduced in size. To facilitate this size reduction, the sizes of the constituent features, such as electrical devices and interconnect line widths, that form the integrated circuits are also constantly being decreased.

The trend of decreasing feature size is evident, for example, in memory circuits or devices such as dynamic random access memories (DRAMs), static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. By decreasing the sizes of constituent electrical devices and the conducting lines that access then, the sizes of the memory devices incorporating these features can be decreased. Additionally, storage capacities can be increased by fitting more memory cells into the memory devices.

The continual reduction in feature sizes places ever greater demands on techniques used to form the features. For example, photolithography is commonly used to pattern features, such as conductive lines, on a substrate. The concept of pitch can be used to describe the size of these features. Pitch is defined as the distance between an identical point in two neighboring features. These features are typically defined by spacings between adjacent features, which are typically filled by a material, such as an insulator. As a result, pitch can be viewed as the sum of the width of a feature and of the width of the space separating that feature from a neighboring feature. Due to factors such as optics and light or radiation wavelength, however, photolithography techniques each have a minimum pitch below which a particular photolithographic technique cannot reliably form features. Thus, the minimum pitch of a photolithographic technique can limit feature size reduction.

Pitch doubling is one method proposed for extending the capabilities of photolithographic techniques beyond their minimum pitch. Such a method is illustrated in FIGS. 1A-1F and described in U.S. Pat. No. 5,328,810, issued to Lowrey et al., the entire disclosure of which is incorporated herein by reference. With reference to FIG. 1A, photolithography is first used to form a pattern of lines 10 in a photoresist layer overlying a layer 20 of an expendable material and a substrate 30. As shown in FIG. 1B, the pattern is then transferred by an etch step (preferably anisotropic) to the layer 20, forming placeholders, or mandrels, 40. The photoresist lines 10 can be stripped and the mandrels 40 can be isotropically etched to increase the distance between neighboring mandrels 40, as shown in FIG. 1C. A layer 50 of material is subsequently deposited over the mandrels 40, as shown in FIG. 1D. Spacers 60, i.e., material extending or originally formed extending from sidewalls of another material, are then formed on the sides of the mandrels 40 by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch formerly included a pattern defining one feature and one space, the same width now includes two features and two spaces defined by the spacers 60. As a result, the smallest feature size possible with a photolithographic technique is effectively decreased.

It will be appreciated that while the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. The conventional terminology is retained herein.

Because the layer 50 of spacer material typically has a single thickness 90 (see FIGS. 1D and 1E) and because the sizes of the features formed by the spacers 60 usually corresponds to that thickness 90, pitch doubling typically produces features of only one width. Circuits, however, often employ features of different sizes. For example, random access memory circuits typically contain arrays of memory cells and logic circuits in the so-called "periphery." In the arrays, the memory cells are typically connected by conductive lines and, in the periphery, the conductive lines typically contact landing pads for connecting arrays to logic. Peripheral features such as landing pads, however, can be larger than the conductive lines. In addition, periphery electrical devices such as transistors can be larger than electrical devices in the array. Moreover, even if peripheral features can be formed with the same pitch as the array, the flexibility required to define circuits will typically not be possible using a single mask, particularly if the patterns are limited to those that can be formed along the sidewalls of patterned photoresist.

Some proposed methods for forming patterns at the periphery and at the array involve etching a pattern into the array region of a substrate and into periphery of the substrate separately. Thus, a pattern in the array is first formed and transferred to the substrate using one mask and then another pattern in the periphery is formed and separately transferred to the substrate using another mask. Because such methods form patterns using different masks at different locations on a substrate, they are limited in their ability to form features that require overlapping patterns, such as when a landing pad overlaps an interconnect line, and yet a third mask may be necessitated to "stitch" two separate patterns with interconnects. Additionally, such a third mask would face even greater challenges with respect to mask alignment due to the fine features defined by the pitch multiplication technique.

Accordingly, there is a need for methods of forming features of different sizes, especially where the features require different overlapping patterns and especially in conjunction with pitch multiplication.

SUMMARY OF THE INVENTION

According to one aspect of the invention, a method is provided for semiconductor processing. The method comprises providing a substrate having a primary mask layer overlying the substrate, a temporary layer overlying the primary mask layer and a first photoresist layer overlying the temporary layer. A photoresist pattern is formed in the first photoresist layer. A first pattern, having features derived from features of the photoresist pattern, is formed in the temporary layer. A second photoresist layer is subsequently formed above the level of the first pattern and an other photoresist pattern is formed in the second photoresist layer. The other photoresist pattern and the first pattern are transferred to the primary mask layer to form a mixed pattern in the primary mask layer. The substrate is processed through the mixed pattern in the primary mask layer. It will be appreciated that the substrate can comprise any material or materials to be processed through the primary masking layer.

According to another aspect of the invention, a method is provided for forming an integrated circuit. The method comprises providing a substrate and forming an amorphous carbon layer over the substrate. A first hardmask layer is formed over the first amorphous carbon layer. A temporary layer is formed over the first hardmask layer and a second hardmask layer is formed over the temporary layer.

According to another aspect of the invention, a method is provided for semiconductor fabrication. The method comprises forming a first pattern by pitch multiplication and separately forming a second pattern by photolithography without pitch multiplication. The first and second patterns are transferred to a mask layer and a substrate is etched through the mask layer.

According to yet another aspect of the invention, a method is provided for forming an integrated circuit. The method comprises forming a mask pattern in which a first part of the mask pattern has a first pitch and a second part of the mask pattern has a second pitch. The first pitch is below a minimum pitch of a photolithographic technique for defining the second pattern. The method also comprises etching a substrate through the mask pattern.

According to another aspect of the invention, a method is provided for forming a memory device. The method comprises forming a pattern of temporary placeholders in a layer over a first carbon layer. A layer of mask material is deposited over surfaces of the temporary placeholders and is then selectively removed from horizontal surfaces of the memory device. The temporary placeholders are selectively removed relative to the mask material to form a pattern of mask material corresponding to features in an array region of the memory device.

According to yet another aspect of the invention, a method is provided for for manufacturing an integrated circuit. The method comprises forming a plurality of mandrel strips. A spacer is formed on sidewalls of each mandrel strip. The mandrel strips are removed to form a pattern of spaced apart spacers. A mask layer is formed in a plane above the spacers and a pattern is formed in the mask layer. The pattern is transferred to the same horizontal plane as the spacers.

According to another aspect of the invention, a method is provided for manufacturing an integrated circuit. The method comprises providing a plurality of spaced-apart lines of a mask material above a substrate, where the mask material is different from photoresist. A plurality of features is defined in a photodefinable material above the substrate by a photolithographic technique. The spaced-apart lines and the plurality of features are replicated in an amorphous carbon layer below the spaced-apart lines.

According to another aspect of the invention, a method is provided for forming a mask pattern to fabricate an integrated circuit. The method comprises providing a plurality of lines of a first mask material. The lines are separated by a first temporary material. The first temporary material is selectively etched. Spaces between the lines are filled with a second temporary material. The second temporary material is selectively etched to open the spaces. A pattern is then formed in a layer of another mask material below the plurality of lines by selectively etching through the spaces.

According to another aspect of the invention, a process is provided for fabricating an integrated circuit. The process comprises providing a masking layer extending over a first and a second region of a partially fabricated integrated circuit. A pattern is formed in the masking layer. A minimum feature size of a portion of the pattern corresponding to the first region is equal to or less than about half a minimum feature size of an other portion of the pattern corresponding to the second region.

According to another aspect of the invention, a partially formed integrated circuit is provided. The partially formed integrated circuit comprises a carbon layer and a plurality of pitch-multiplied spacers on a level overlying the carbon layer. The spacers have a pitch of about 100 nm or less.

According to yet another aspect of the invention, a partially formed integrated circuit is provided. The partially formed integrated circuit comprises a substrate and a primary mask layer overlying the substrate. The primary mask layer formed of a material different from photoresist. A mask material defining a first pattern is disposed in a first plane overlying the primary mask layer. A photodefinable material defining a second pattern is disposed in a second plane overlying the mask material.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
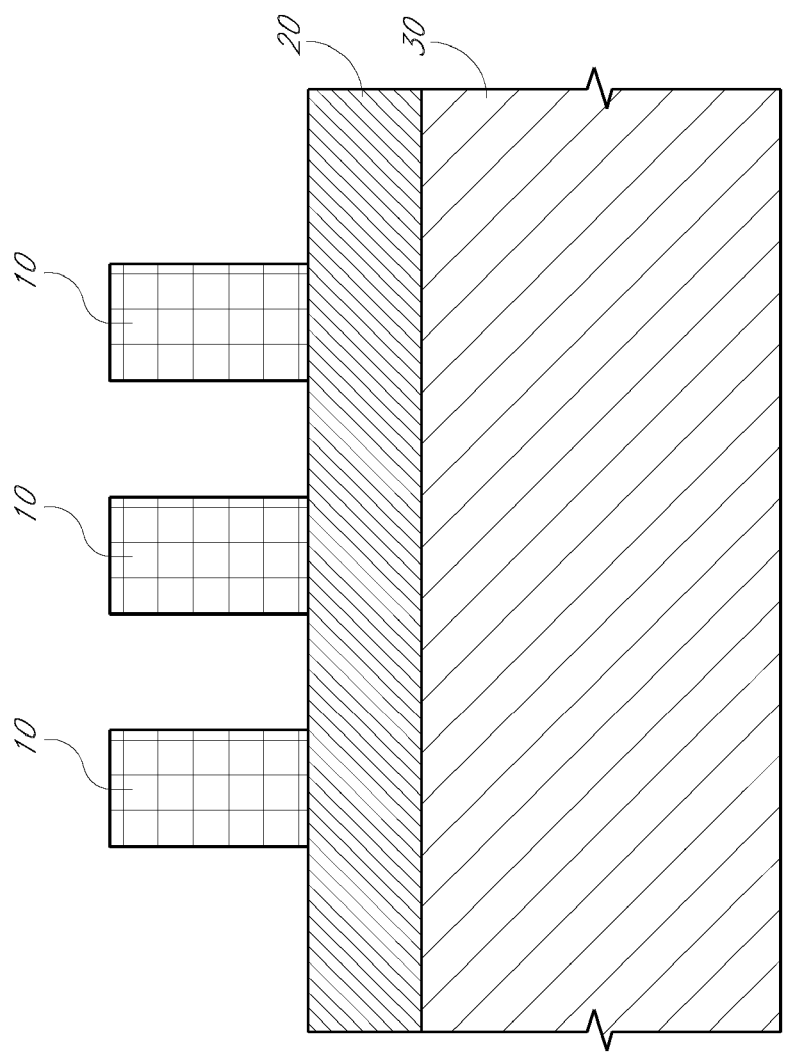
FIGS. 1A-1F are schematic, cross-sectional side views of partially formed conductive lines, formed in accordance with a prior art pitch doubling method.
Figure 1B:
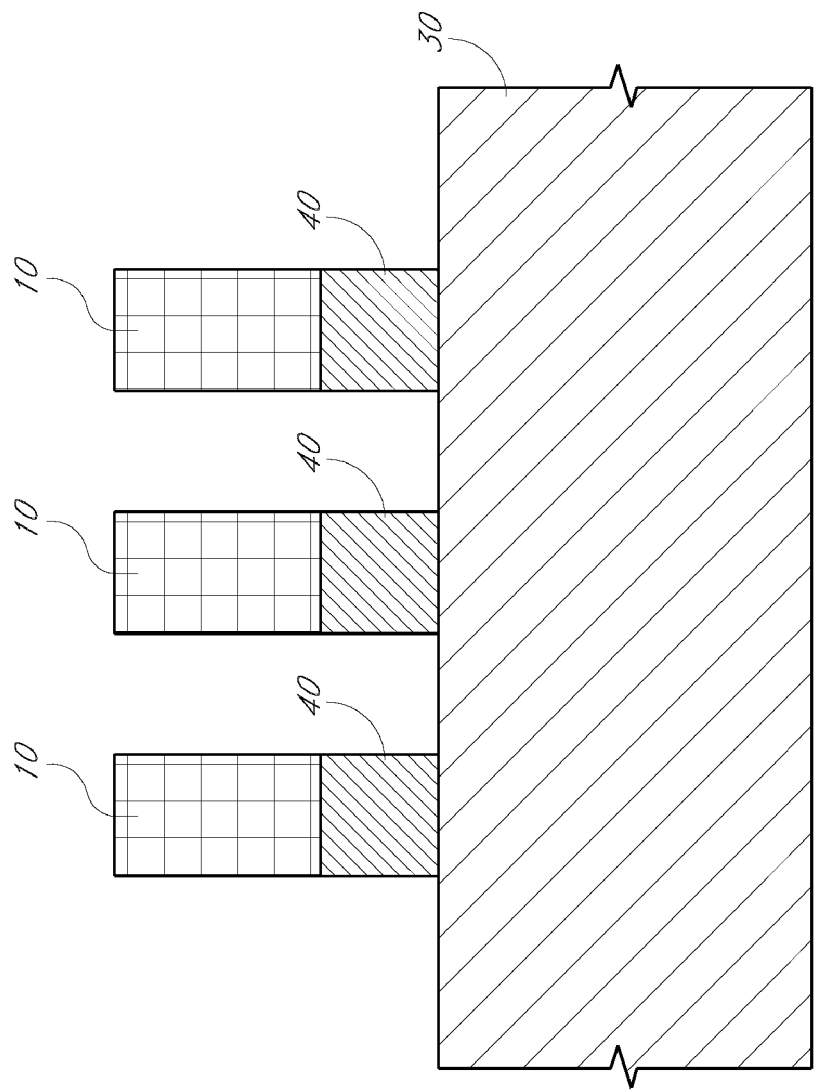
Figure 1C:
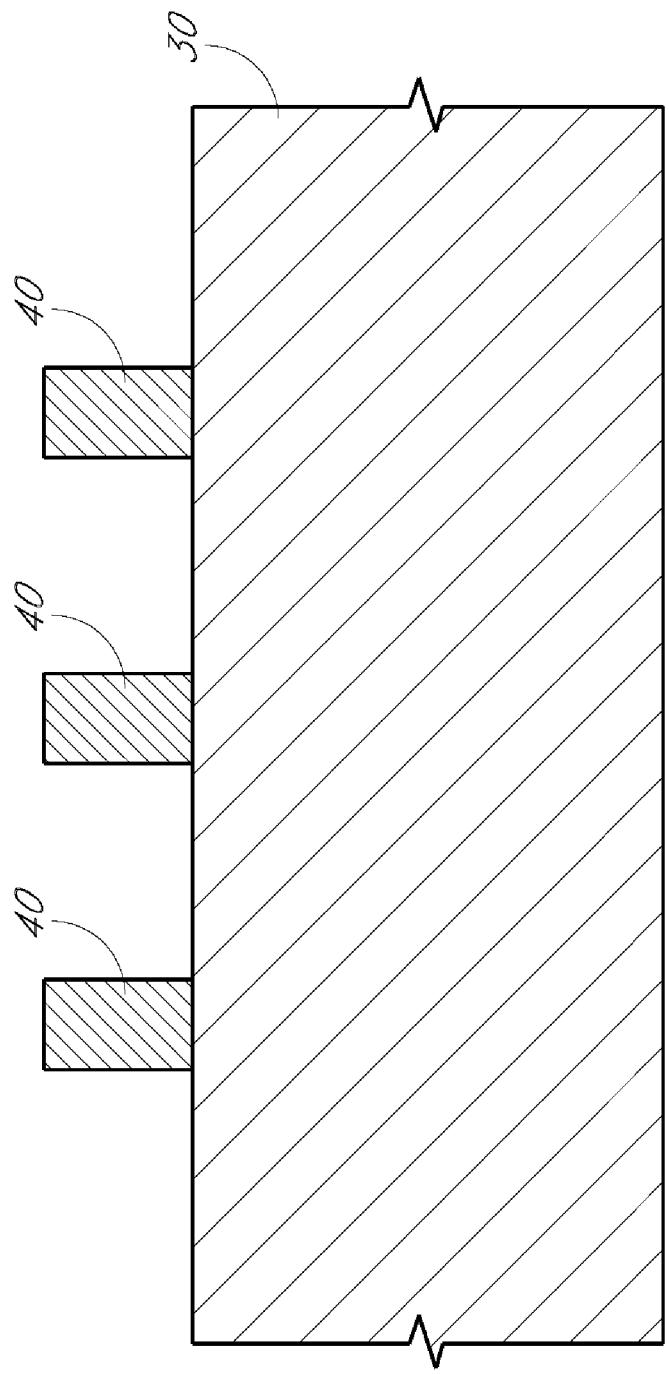
Figure 1D:
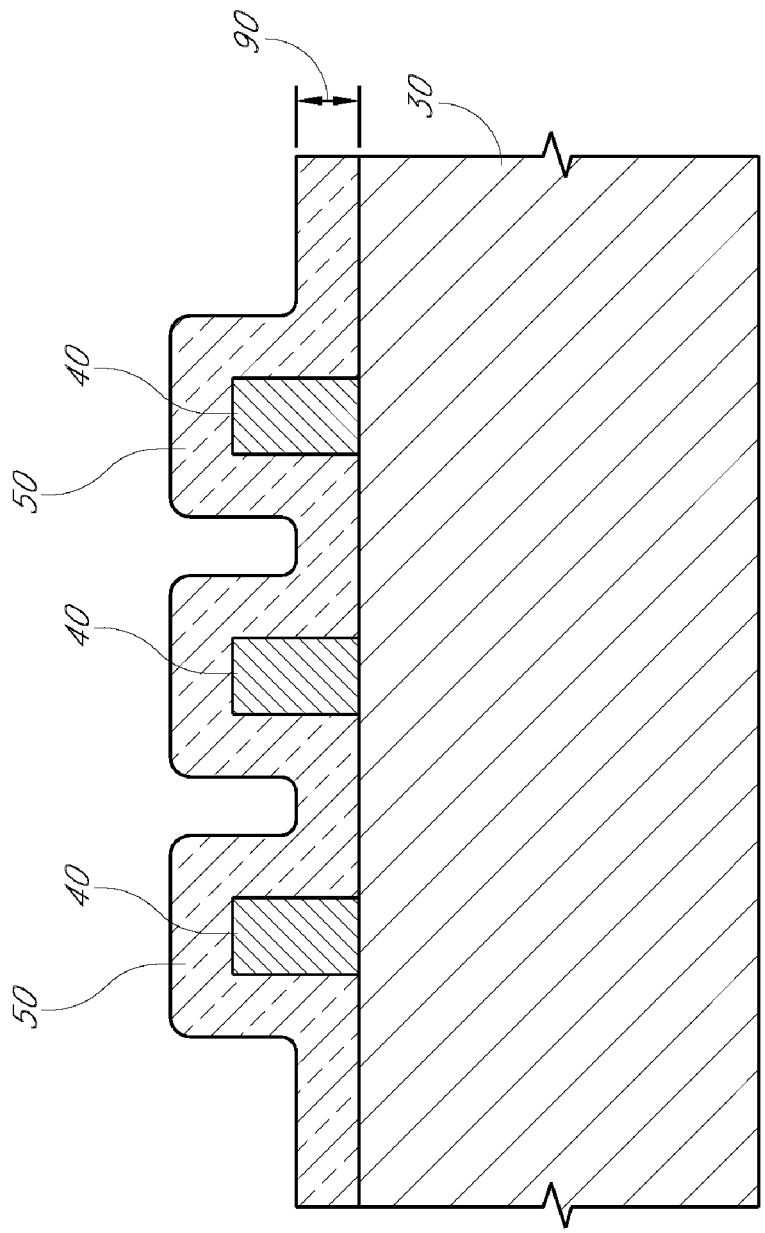
Figure 1E:
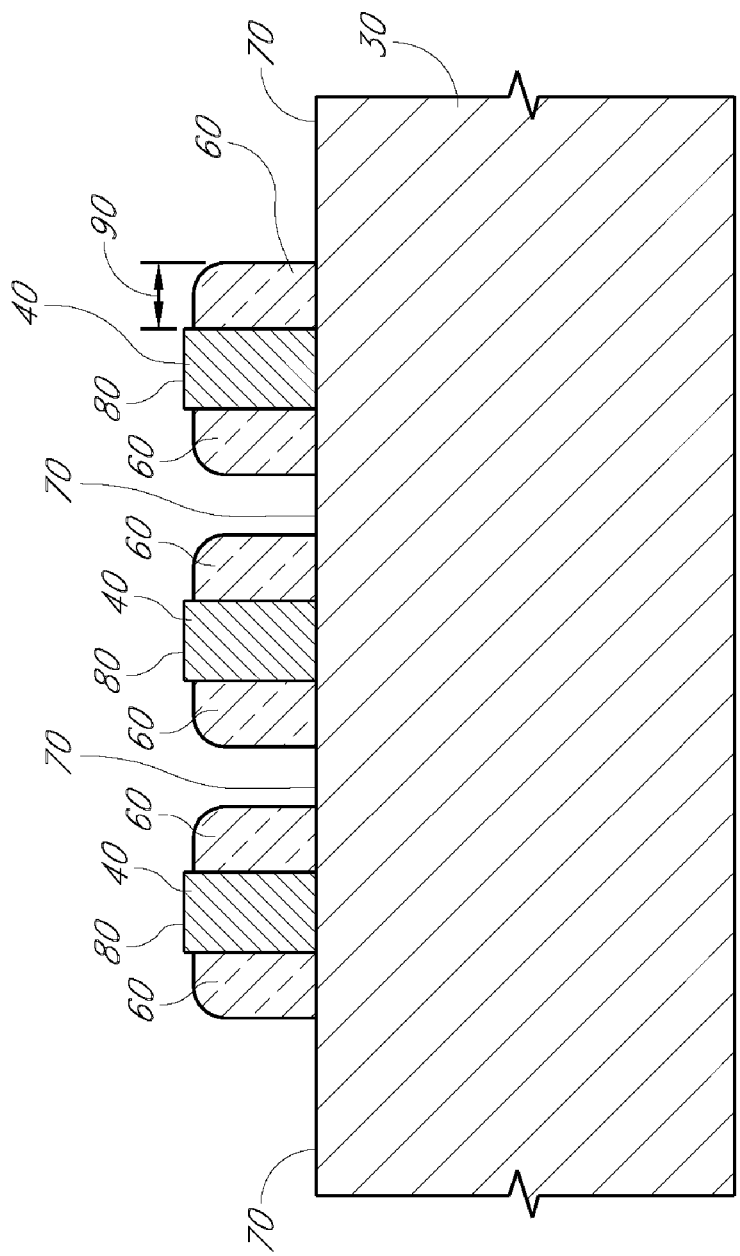
Figure 1F:
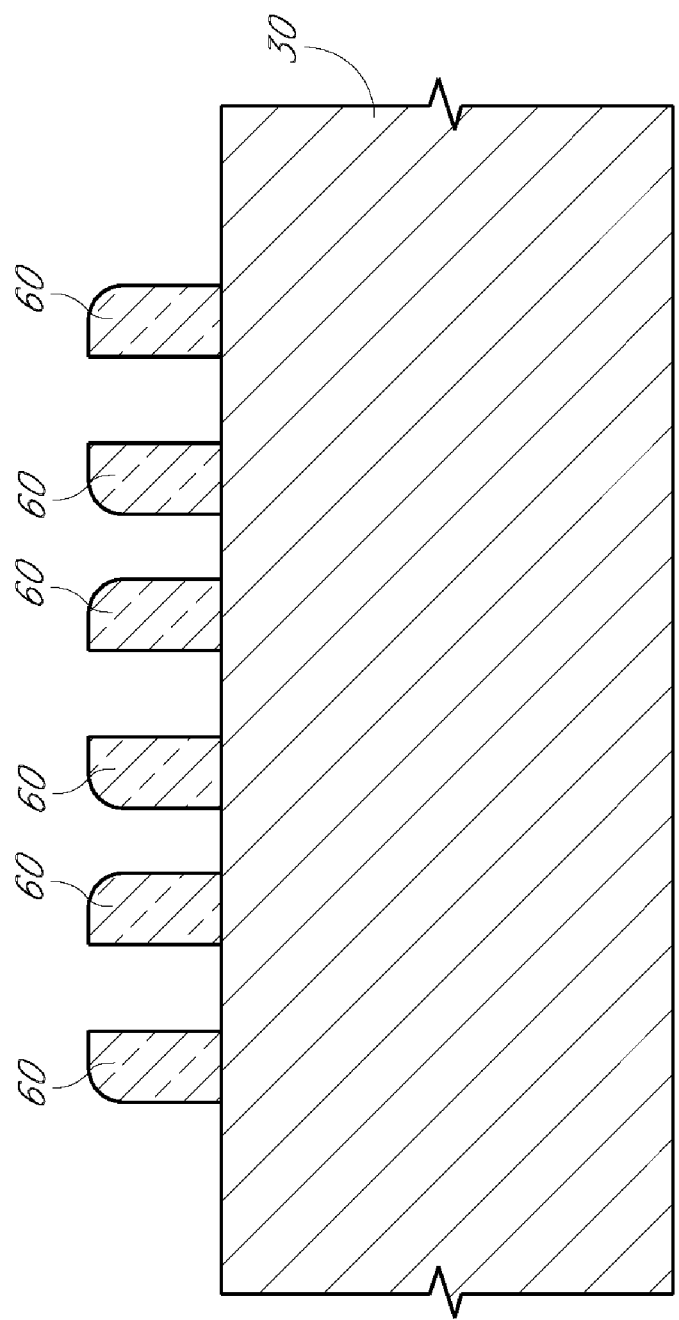

In addition to problems with forming different size features, it has been found that pitch doubling techniques can have difficulty transferring spacer patterns to a substrate. In particular, in common methods of transferring patterns, both the spacers and the underlying substrate are exposed to an etchant, which preferentially etches away the substrate material. It will be appreciated, however, that the etchants also wear away the spacers, albeit at a slower rate. Thus, over the course of transferring a pattern, the spacers can be worn away by the etchant before the pattern transfer is complete. These difficulties are exacerbated by the trend towards decreasing feature size, which, for example, increasingly leads to higher aspect ratios as the widths of these trenches decrease. In conjunction with difficulties of producing structures of different feature sizes, these pattern transfer limitations make even more difficult the application of pitch-doubling principles to integrated circuit manufacture.

In view of these difficulties, preferred embodiments of the invention allow for improved pattern transfer and for the formation of different size features in conjunction with pitch doubling. In a first phase of the method, photolithography and pitch doubling are preferably used to form a spacer pattern. This typically forms features of one size in one region of the chip, e.g., the array of a memory chip. In a second phase, photolithography is again performed to form a second pattern in another region of the chip, e.g., the periphery of the memory chip, in a layer overlying the spacer pattern. Both the spacer pattern and the second pattern are then transferred to an underlying primary masking layer, which preferably can be preferentially etched relative to an underlying substrate. The spacer and second patterns are then transferred from the primary masking layer to the underlying substrate in a single step. Thus, patterns for forming different size features, some of which are below the minimum pitch of the photolithographic technique used for patterning, can be formed and these patterns can be successfully transferred to the underlying substrate.

Moreover, because the second pattern is initially formed on a layer overlying the spacer pattern, the second pattern can overlap the spacer pattern. As a result, overlapping features of different sizes, such as conducting lines and landing pads or periphery transistors, can advantageously be formed.

Preferably, the primary masking layer is the masking layer that directly overlies and, due to etch selectivity, is primarily used to perform a process (e.g., etch) on the substrate through the primary masking layer. In particular, the primary masking layer is preferably formed of a material that allows good etch selectivity relative to both the spacer material and the substrate material, so that spacer pattern can effectively be transferred to it; so that the primary masking layer can be selectively removed after processing without harming the substrate; and, when the mask is used for etching the substrate, so that the pattern in it can effectively be transferred to the substrate. Due to its excellent etch selectivity relative to a variety of materials, including oxides, nitrides and silicon, the primary masking layer is preferably formed of carbon and, more preferably, amorphous carbon.

It will be appreciated that a substrate can comprise any material or materials that are to be processed through the primary masking layer. Thus, a substrate can include a layer of a single material, a plurality of layers of different materials, a layer or layers having regions of different materials or structures in them, etc. These materials can include semiconductors, insulators, conductors, or combinations thereof. Typically, the substrate comprises structures or layers ultimately form part of the integrated circuit being fabricated.

It will also be appreciated that transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however. For example, depending upon etch chemistries and conditions, the sizes of and relative spacings between the features forming the transferred pattern can be enlarged or diminished relative to the pattern on the first level, while still resembling the same initial "pattern."

Reference will now be made to the Figures, wherein like numerals refer to like parts throughout. It will be appreciated that FIGS. 2-16 are not necessarily drawn to scale.

While the preferred embodiments will find application in any context in which features of different sizes are formed on a substrate, in particularly advantageous embodiments, part of the pattern to be transferred to a substrate is formed by pitch multiplication and that has a pitch below the minimum pitch of the photolithographic technique used for processing the substrate. In addition, while the preferred embodiments can be used to form any integrated circuit, they are particularly advantageously applied to form devices having arrays of electrical devices, including logic or gate arrays and volatile and non-volatile memory devices such as DRAM, ROM or flash memory. In such devices, pitch multiplication can be used to form, e.g., transistor gate electrodes and conductive lines in the array region of the chips, while conventional photolithography can be used to form larger features, such as contacts, at the peripheries of the chips. Exemplary masking steps in the course of fabricating a memory chip are illustrated in the Figures.

Figure 2A:
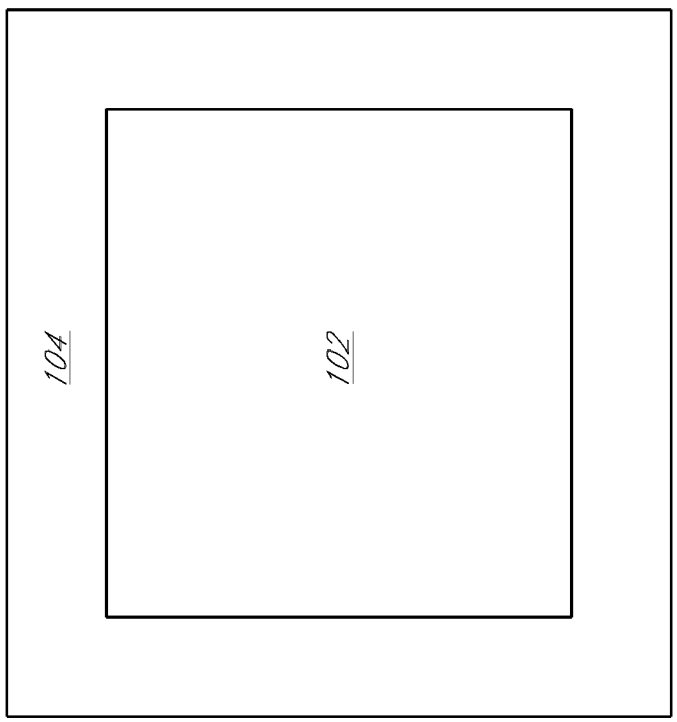
FIGS. 2A-2B are a schematic, cross-sectional top and side views of a partially formed memory device, in accordance with preferred embodiments of the invention.

FIG. 2A shows a top view of a partially fabricated integrated circuit, or memory chip, 100. A central region 102, the "array," is surrounded by a peripheral region 104, the "periphery." It will be appreciated that, after fabrication of the integrated circuit 100 is complete, the array 102 will typically be densely populated with conducting lines and electrical devices such as transistors and capacitors. Desirably, pitch multiplication can be used to form features in the array 102, as discussed below. On the other hand, the periphery 104 can have features larger than those in the array 102. Conventional photolithography, rather than pitch multiplication, is typically used to pattern these features, because the geometric complexity of logic circuits located in the periphery 104 makes using pitch multiplication difficult. In addition, some devices in the periphery require larger geometries due to electrical constraints, thereby making pitch multiplication less advantageous than conventional photolithography for such devices.

Figure 2B:
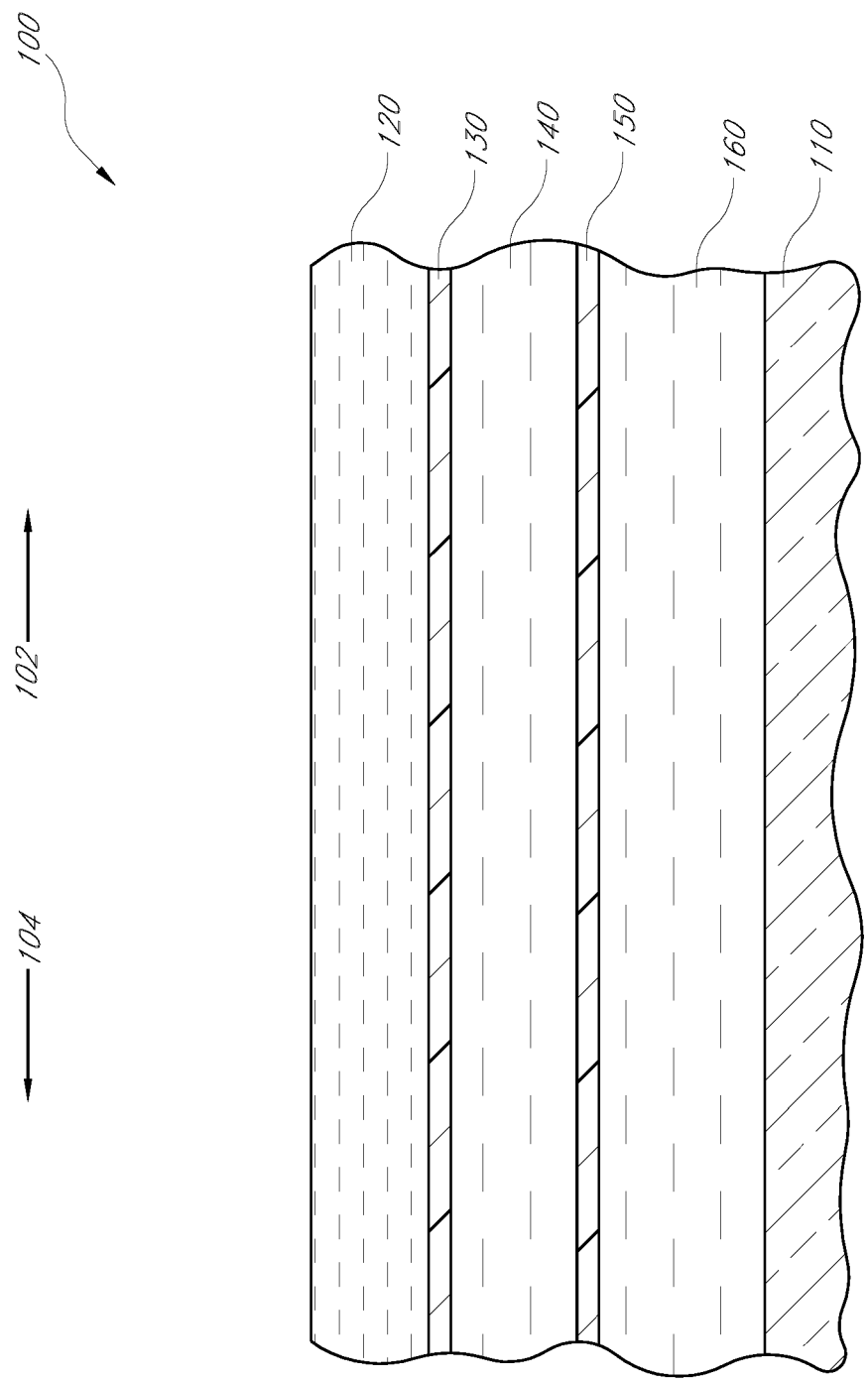

With reference to FIG. 2B, a partially formed integrated circuit 100 is provided. A substrate 110 is provided below various layers 120-160. The substrate 110 will be patterned to form various features and the layers 120-160 will be etched to form a mask for the pattern, as discussed below. The materials for the layers overlying the substrate 110 are preferably chosen based upon consideration of the chemistry and process condition requirements for the various pattern forming and pattern transferring steps discussed herein. Because the layers between a topmost selectively definable layer 120, which preferably is definable by a lithographic process, and the substrate 110 function to transfer a pattern derived from the selectively definable layer 120 to the substrate 110, the layers between the selectively definable layer 120 and the substrate 110 are preferably chosen so that they can be selectively etched relative to other exposed materials during their etch. It will be appreciated that a material is considered selectively, or preferentially, etched when the etch rate for that material is at least about 5 times greater, preferably about 10 times greater, more preferably about 20 times greater and, most preferably, at least about 40 times greater than that for surrounding materials.

In the illustrated embodiment, the selectively definable layer 120 overlies a first hard mask, or etch stop, layer 130, which overlies a temporary layer 140, which overlies a second hard mask, or etch stop, layer 150, which overlies a primary mask layer 160, which overlies the substrate 110 to be processed (e.g., etched) through a mask. The thicknesses of the layers are preferably chosen depending upon compatibility with the etch chemistries and process conditions described herein. For example, when transferring a pattern from an overlying layer to an underlying layer by selectively etching the underlying layer, materials from both layers are removed to some degree. Thus, the upper layer is preferably thick enough so that it is not worn away over the course of the etch.

In the illustrated embodiment, the first hard mask layer 130 is preferably between about 10-50 nm thick and, more preferably, between about 10-30 nm thick. The temporary layer 140 is preferably between about 100-300 nm thick and, more preferably, between about 100-200 nm thick. The second hard mask layer 150 is preferably between about 10-50 nm thick and, more preferably, about 20-40 nm thick and the primary mask layer 160 is preferably between about 100-1000 nm thick and, more preferably, about 100-500 nm thick.

With reference to FIG. 2, the selectively definable layer 120 is preferably formed of a photoresist, including any photoresist known in the art. For example, the photoresist can be any photoresist compatible with 13.7 nm, 157 nm, 193 nm, 248 nm or 365 nm wavelength systems, 193 nm wavelength immersion systems or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises a silicon oxide ($SiO_2$), silicon or a dielectric anti-reflective coating (DARC), such as a silicon-rich silicon oxynitride. DARCs can be particularly advantageous for forming patterns having pitches near the resolution limits of a photolithographic technique because they can enhance resolution by minimizing light reflections. It will be appreciated that light reflections can decrease the precision with which photolithography can define the edges of a pattern. Optionally, a bottom anti-reflective coating (BARC) (not shown) can similarly be used in addition to the first hard mask layer 130 to control light reflections.

The temporary layer 140 is preferably formed of amorphous carbon, which offers very high etch selectivity relative to the preferred hard mask materials. More preferably, the amorphous carbon is a form of transparent carbon that is highly transparent to light and which offers further improvements for photo alignment by being transparent to wavelengths of light used for such alignment. Deposition techniques for forming a highly transparent carbon can be found in A. Helmbold, D. Meissner, Thin Solid Films, 283 (1996) 196-203, the entire disclosure of which is incorporated herein by reference.

As with the first hard mask layer 130, the second hard mask layer 150 preferably comprises a dielectric anti-reflective coating (DARC) (e.g., a silicon oxynitride), a silicon oxide ($SiO_2$) or silicon. In addition, a bottom anti-reflective coating (BARC) (not shown) can also optionally be used to control light reflections. While the first and the second hard mask layers 130 and 150 can be formed of different materials, these layers are preferably formed of the same material for ease of processing and to minimize the number of different etch chemistries utilized, as described below. Like the temporary layer 140, the primary mask layer 160 is preferably formed of amorphous carbon and, more preferably, transparent carbon.

It will be appreciated that the various layers discussed herein can be formed by various methods known to those of skill in the art. For example, various vapor deposition processes, such as chemical vapor deposition can be used to form the hard mask layers. Preferably, a low temperature chemical vapor deposition process is used to deposit the hard mask layers or any other materials, e.g., spacer material (FIG. 7), over the mask layer 160, where the mask layer 160 is formed of amorphous silicon. Such low temperature deposition processes advantageously prevent chemical or physical disruption of the amorphous carbon layer.

Spin-on-coating processes can be used to form the photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference.

Figure 3:
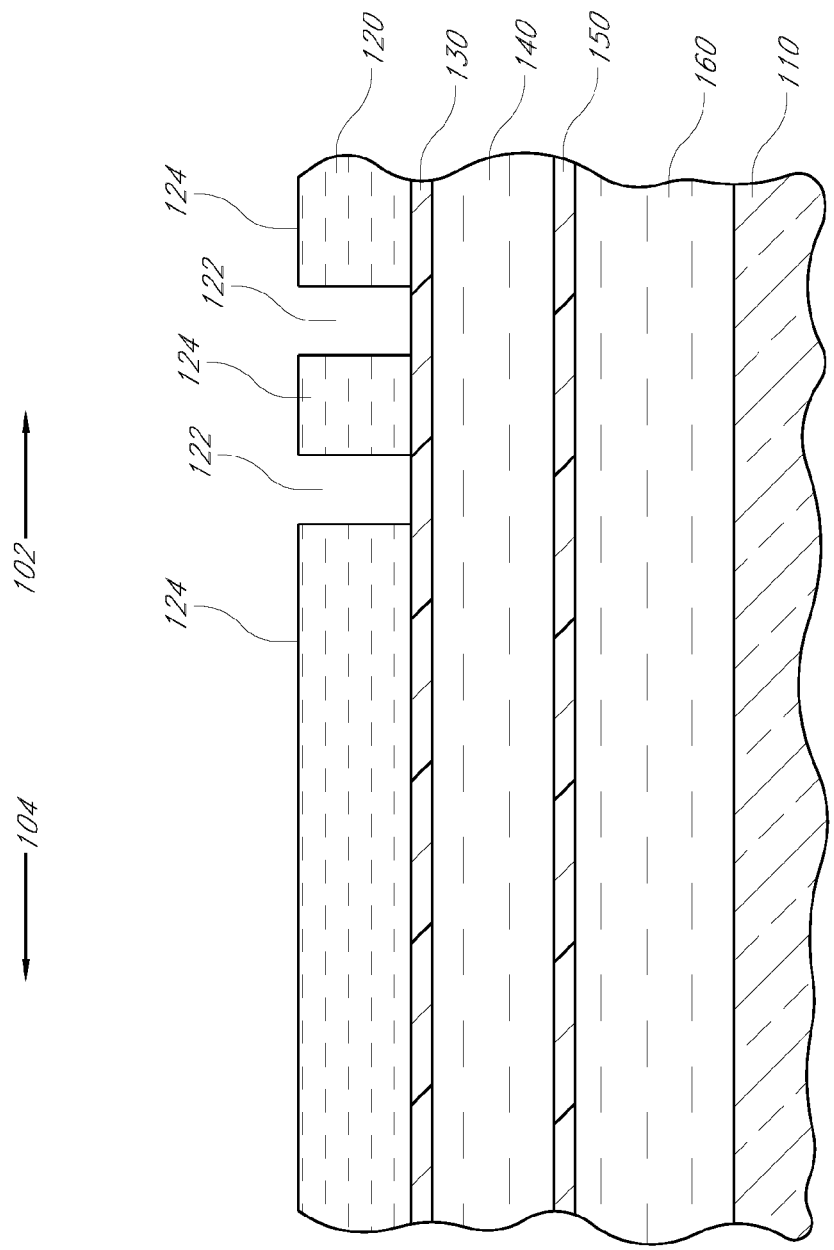
FIG. 3 is a schematic, cross-sectional side view of the partially formed memory device of FIG. 2 after forming lines in a selectively definable layer in the array of the memory device, in accordance with preferred embodiments of the invention.

In a first phase of the method in accordance with the preferred embodiments and with reference to FIGS. 3-9, pitch multiplication in the array of the partially formed integrated circuit 100 is performed. A pattern is formed on the photodefinable layer 120, as shown in FIG. 3. The photodefinable layer 120 can be patterned by, e.g., photolithography, in which the layer 120 is exposed to radiation through a reticle and then developed. After being developed, the remaining photodefinable material, photoresist in this case, comprises lines 122, which define spaces 124.

Figure 4:
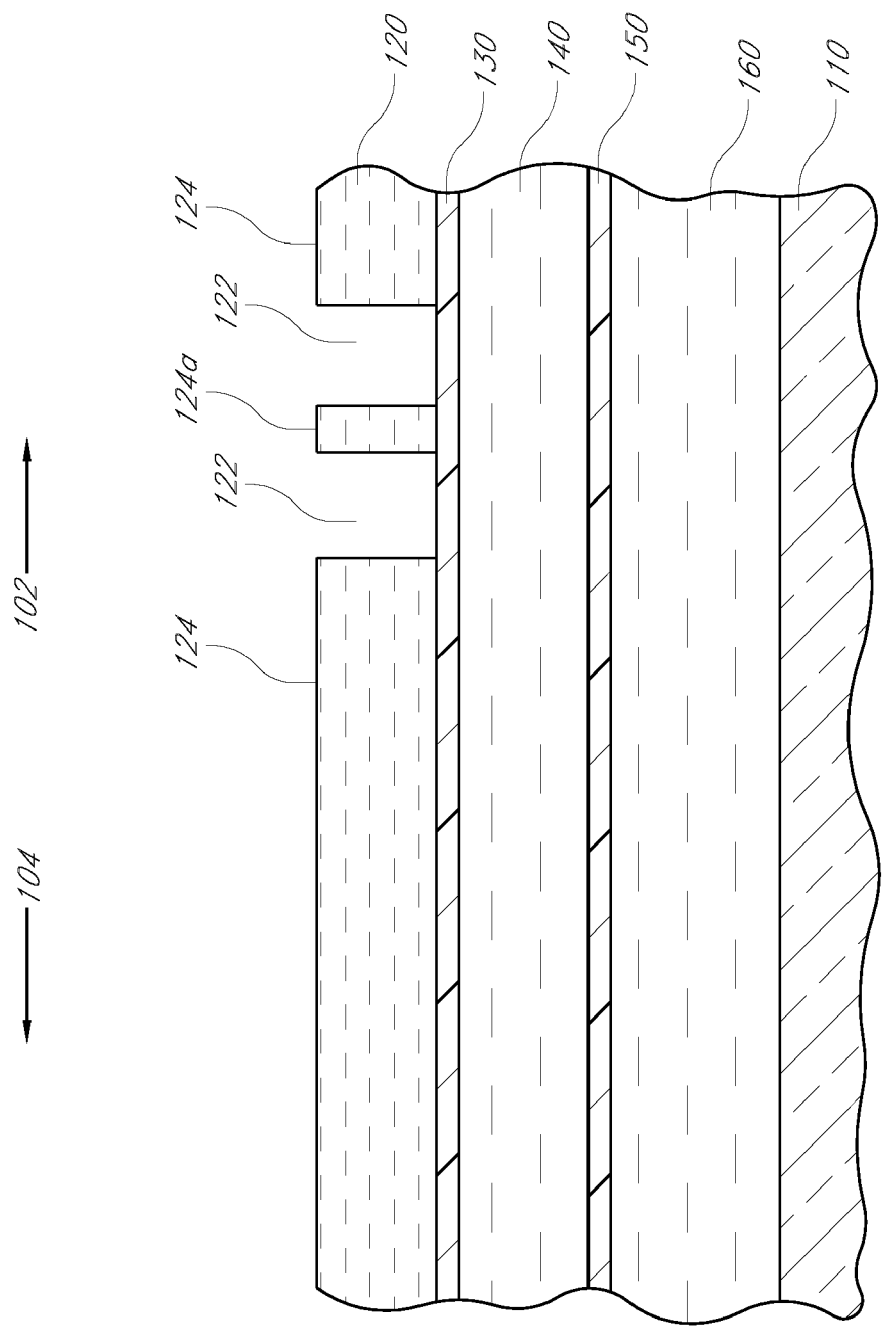
FIG. 4 is a schematic, cross-sectional side view of the partially formed memory device of FIG. 3 after widening spaces between photoresist lines, in accordance with preferred embodiments of the invention.

As shown in FIG. 4, the widths of the spaces 122 and the photoresist lines 122 can be altered to a desired dimension. For example, the spaces 122 can be widened by etching the photoresist lines 124. The photoresist lines 124 are preferably etched using an isotropic etch, such as a sulfur oxide plasma, e.g., a plasma comprising $SO_2$, $O_2$, $N_2$ and Ar. The extent of the etch is preferably selected so that a resulting line 124*a* has a width corresponding to the desired spacing of the spacers to be formed, as will be appreciated from the discussion below with respect to FIGS. 8-16. Advantageously, in addition to allowing the formation of lines 124*a* that are narrower than features defined by the photolithographic technique used to pattern the photodefinable layer 120, this etch can smooth the edges of the lines 124 thereby improving the uniformity of the lines 124. The resulting photoresist lines 124 and 124*a* thus constitute the placeholders or mandrels upon which a pattern of spacers 175 (FIG. 9) will be formed. In other embodiments, the spaces between the spaces 122 can be narrowed by expanding the lines 124 to a desired size. For example, additional material can be deposited over the lines 124 or the lines 124 can be chemically reacted to form a material having a larger volume to increase their size.

The pattern of the (modified) photodefinable layer 120 is preferably transferred to a layer 140 of material that can withstand with the process conditions for spacer material deposition, discussed below. In addition to having higher heat resistance than photoresist, the material forming the temporary layer 140 is preferably selected such that it can be selectively removed relative to the spacer material and the underlying layer. As noted above, the layer 140 is preferably formed of amorphous carbon. Because the preferred chemistries for etching photoresist also typically etch significant amounts of amorphous carbon and because chemistries are available for etching amorphous carbon with excellent selectivity relative to a variety of materials, a hard mask layer 130 selected from such materials preferably separates the layers 120 and 140. Suitable materials for the hard mask layer 130 include, for example, DARCs, silicon oxides or nitrides, and silicon.

Figure 5:
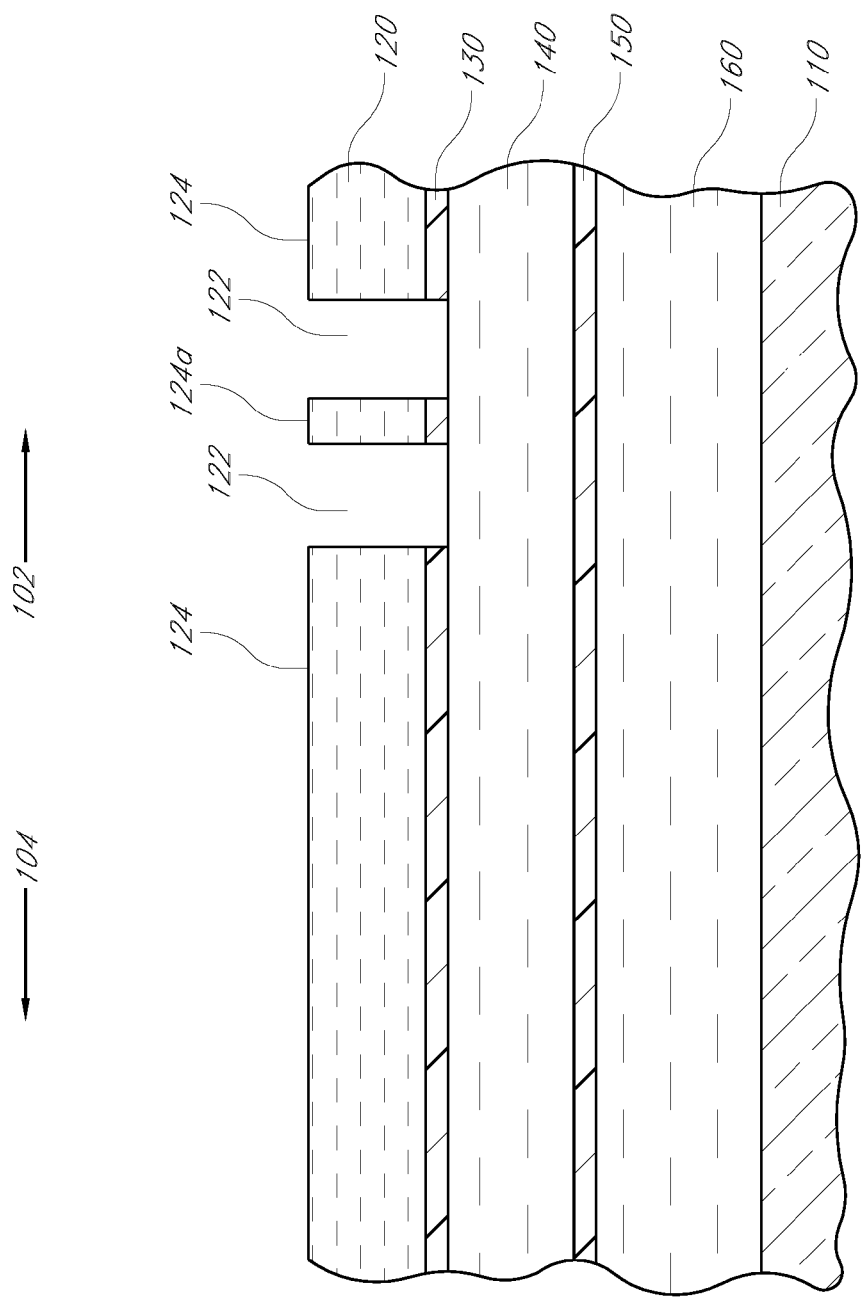
FIG. 5 is a schematic, cross-sectional side view of the partially formed memory device of FIG. 4 after etching through a hard mask layer, in accordance with preferred embodiments of the invention.

The pattern in the photodefinable layer 120 is preferably transferred to the hard mask layer 130, as shown in FIG. 5. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries can include $CF_4$, $CFH_3$, $CF_2H_2$, $CF_3H$, etc.

Figure 6:
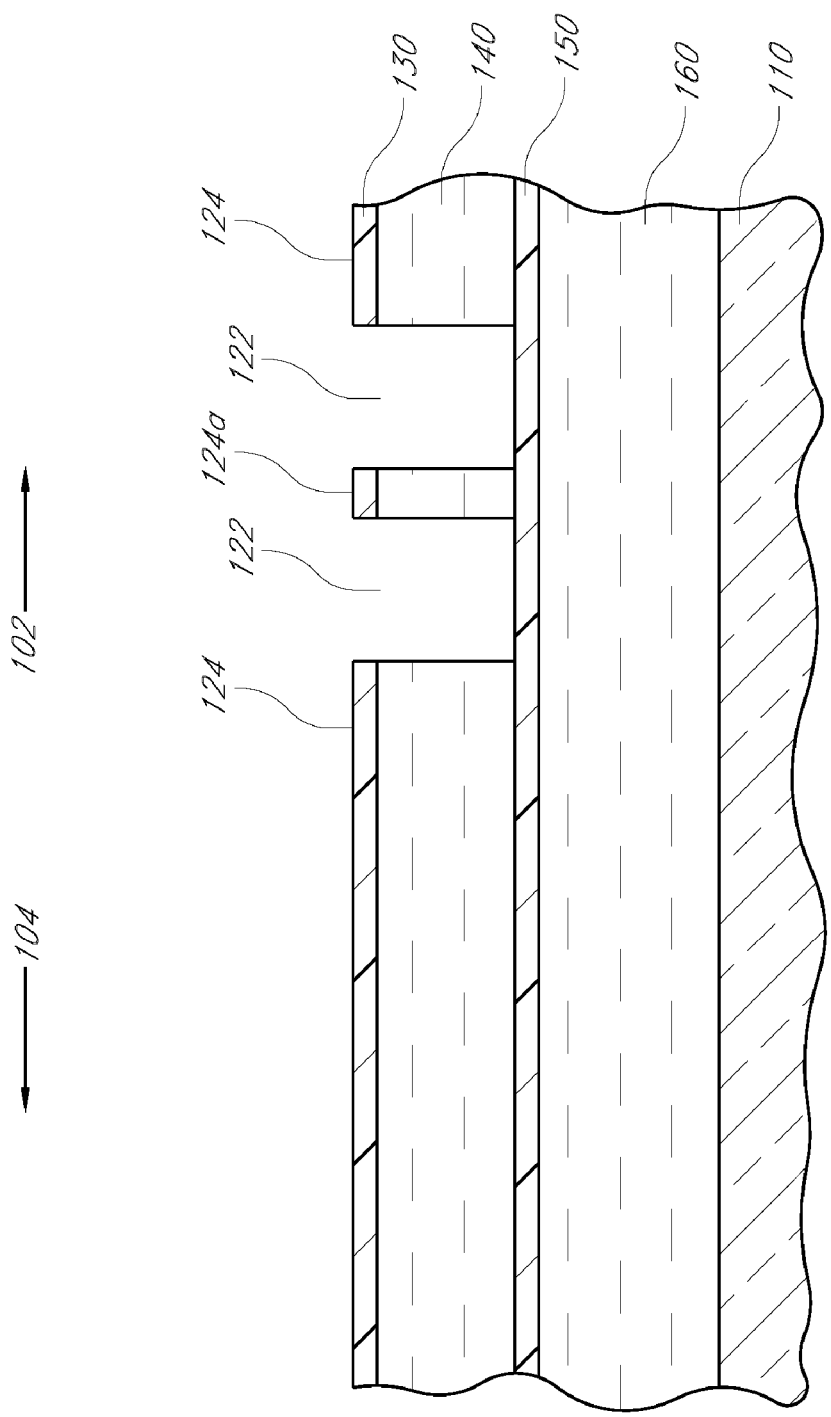
FIG. 6 is a schematic, cross-sectional side view of the partially formed memory device of FIG. 5 after transferring a pattern from the photoresist layer to a temporary layer, in accordance with preferred embodiments of the invention.

The pattern is then transferred to the temporary layer 140, as shown in FIG. 6, preferably using a $SO_2$-containing plasma, e.g., a plasma containing $SO_2$, $O_2$ and Ar. Advantageously, the $SO_2$-containing plasma can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, entitled Critical Dimension Control, MICRON.286A (Micron Ref. No. 03-1348.00/US), the entire disclosure of which is incorporate herein by reference. It will be appreciated that the $SO_2$-containing plasma simultaneously etches the temporary layer 140 and removes the photodefinable layer 120.

Figure 7:
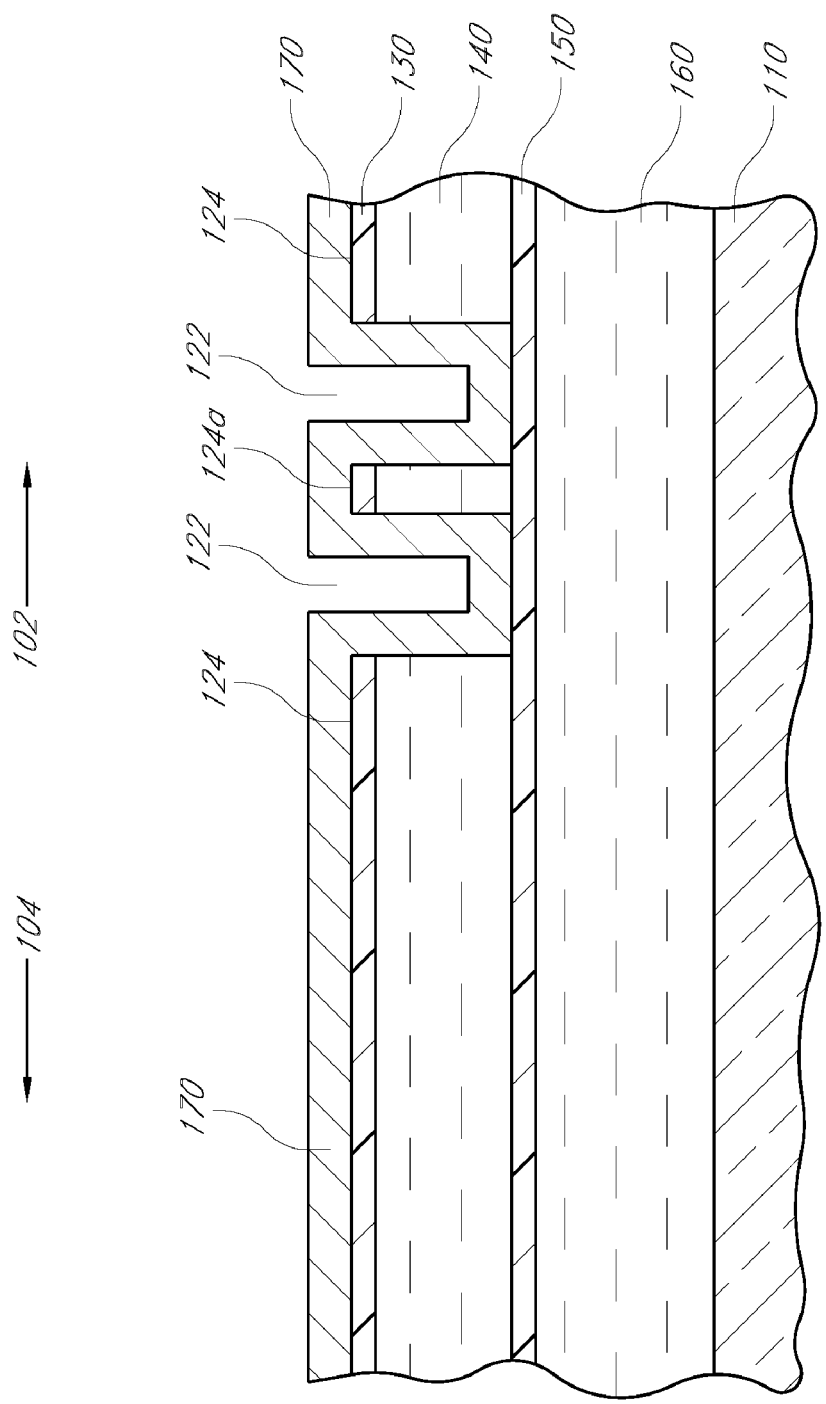
FIG. 7 is a schematic, cross-sectional side view of the partially formed memory device of FIG. 6 after depositing a layer of a spacer material, in accordance with preferred embodiments of the invention.

As shown in FIG. 7, a layer 170 of spacer material is preferably next deposited over the hard mask layer 130 and the temporary layer 140. The spacer material is preferably deposited by chemical vapor deposition or atomic layer deposition. The spacer material can be any material capable of use as a mask to transfer a pattern to the underlying primary mask layer 160. The spacer material preferably: 1) can be deposited with good step coverage, 2) can be deposited at a low temperature compatible with the temporary layer 140 and 3) can be selectively etched relative to the temporary layer 140 and any layer underlying the temporary layer 140. Preferred materials include silicon nitrides and silicon oxides.

Figure 8:
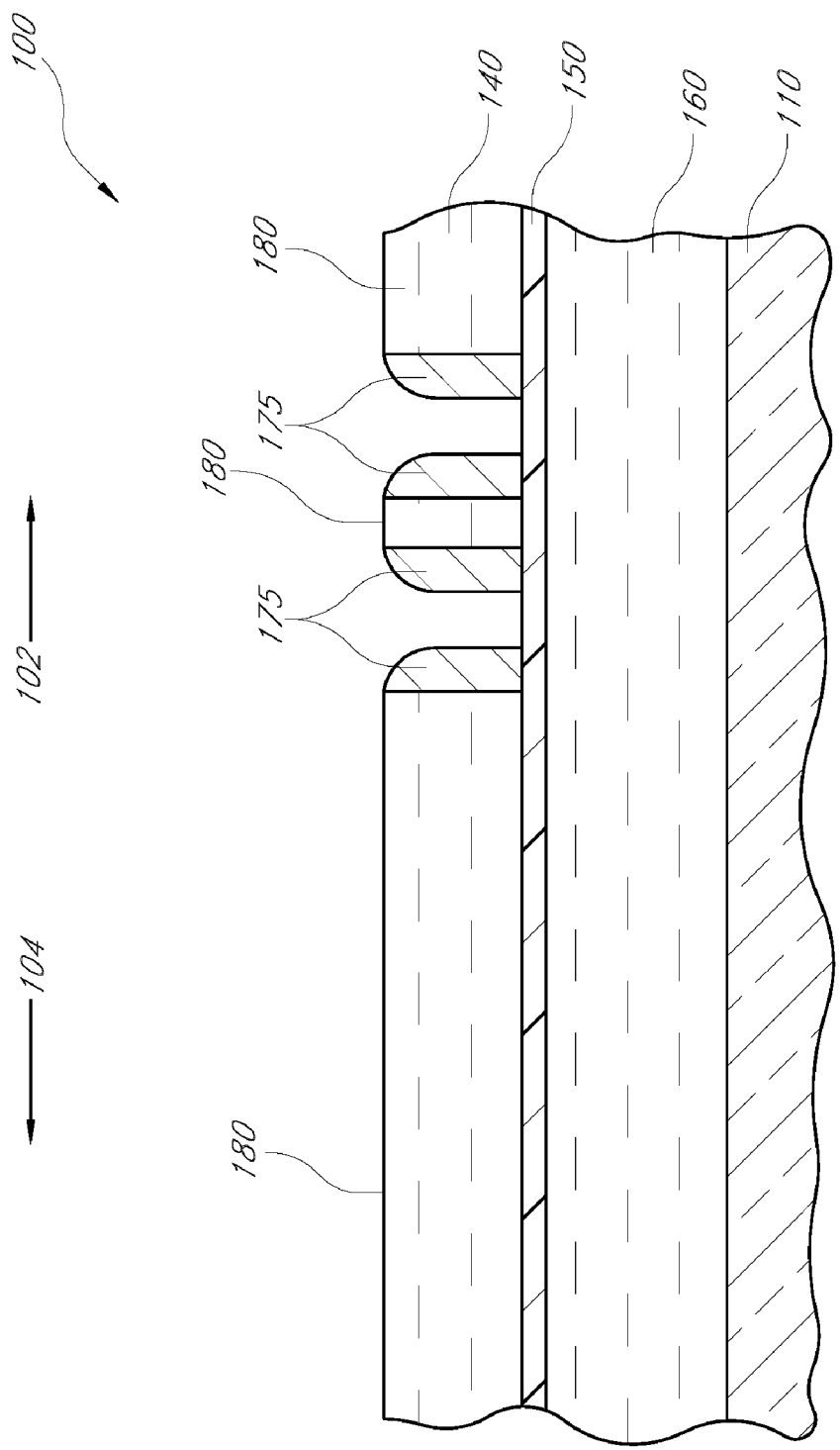
FIG. 8 is a schematic, cross-sectional side view of the partially formed memory device of FIG. 7 after a spacer etch, in accordance with preferred embodiments of the invention.
Figure 9:
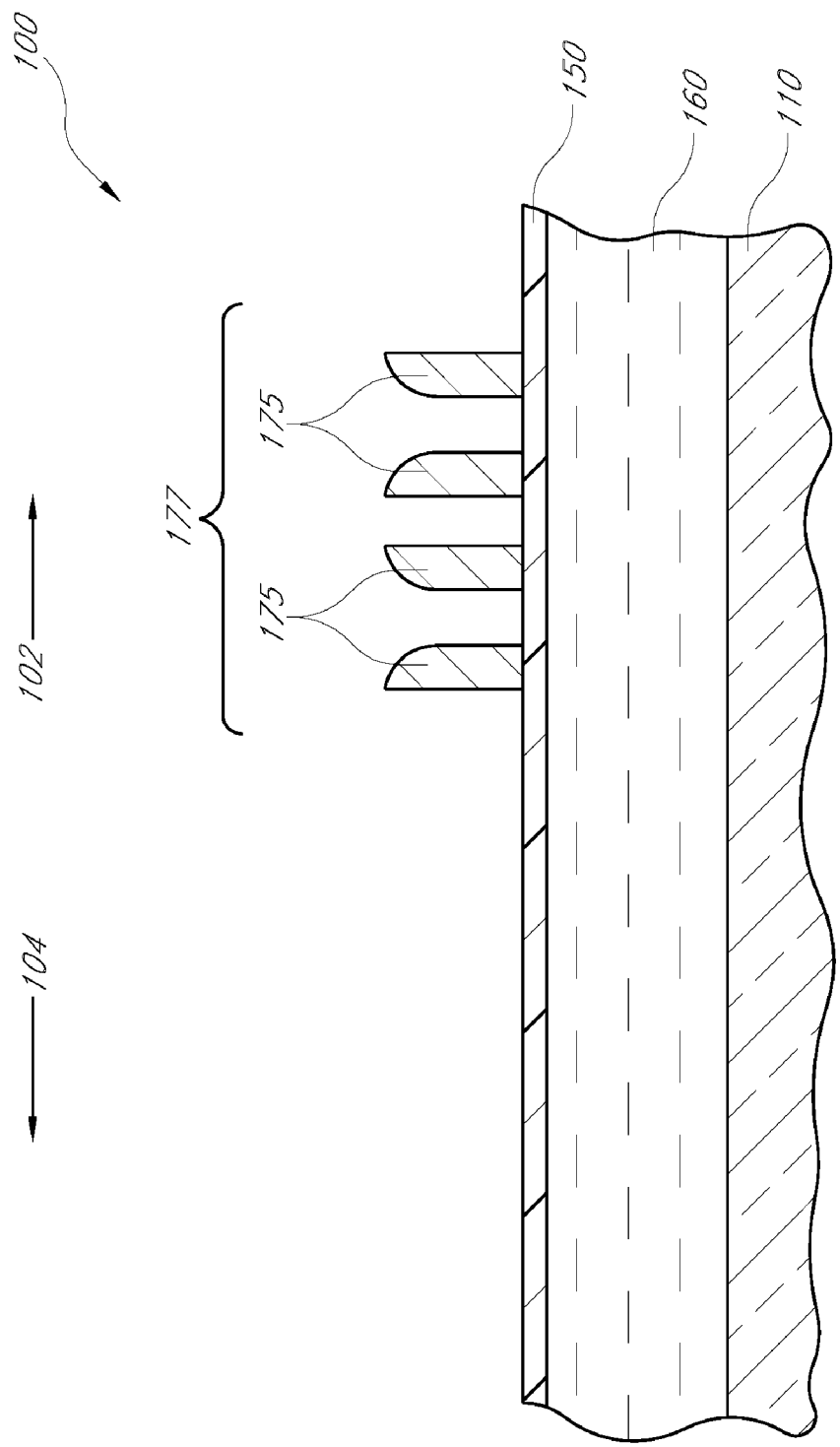
FIG. 9 is a schematic, cross-sectional side view of the partially formed memory device of FIG. 8 after removing a remaining portion of the temporary layer to leave a pattern of spacers in the array of the memory device, in accordance with preferred embodiments of the invention.

As shown in FIG. 8, the spacer layer 170 is then subjected to an anisotropic etch to remove spacer material from horizontal surfaces 180 of the partially formed integrated circuit 100. Such an etch, also known as a spacer etch, can be performed using a fluorocarbon plasma, which can also advantageously etch the hard mask layer 130. Next, the amorphous carbon layer 140 can be selectively removed, using, e.g., a $SO_2$-containing plasma. FIG. 9 shows a pattern of spacers 175 left after the amorphous carbon etch. Thus, pitch multiplication in the array of the partially formed integrated circuit 100 has been accomplished and, in the illustrated embodiment, the pitch of the spacers is half that of the photoresist lines 124 (FIG. 3) originally formed by photolithography. It will be appreciated that the spacers 175 generally follow the outline of the pattern or lines 124 originally formed in the photodefinable layer 120.

Figure 10:
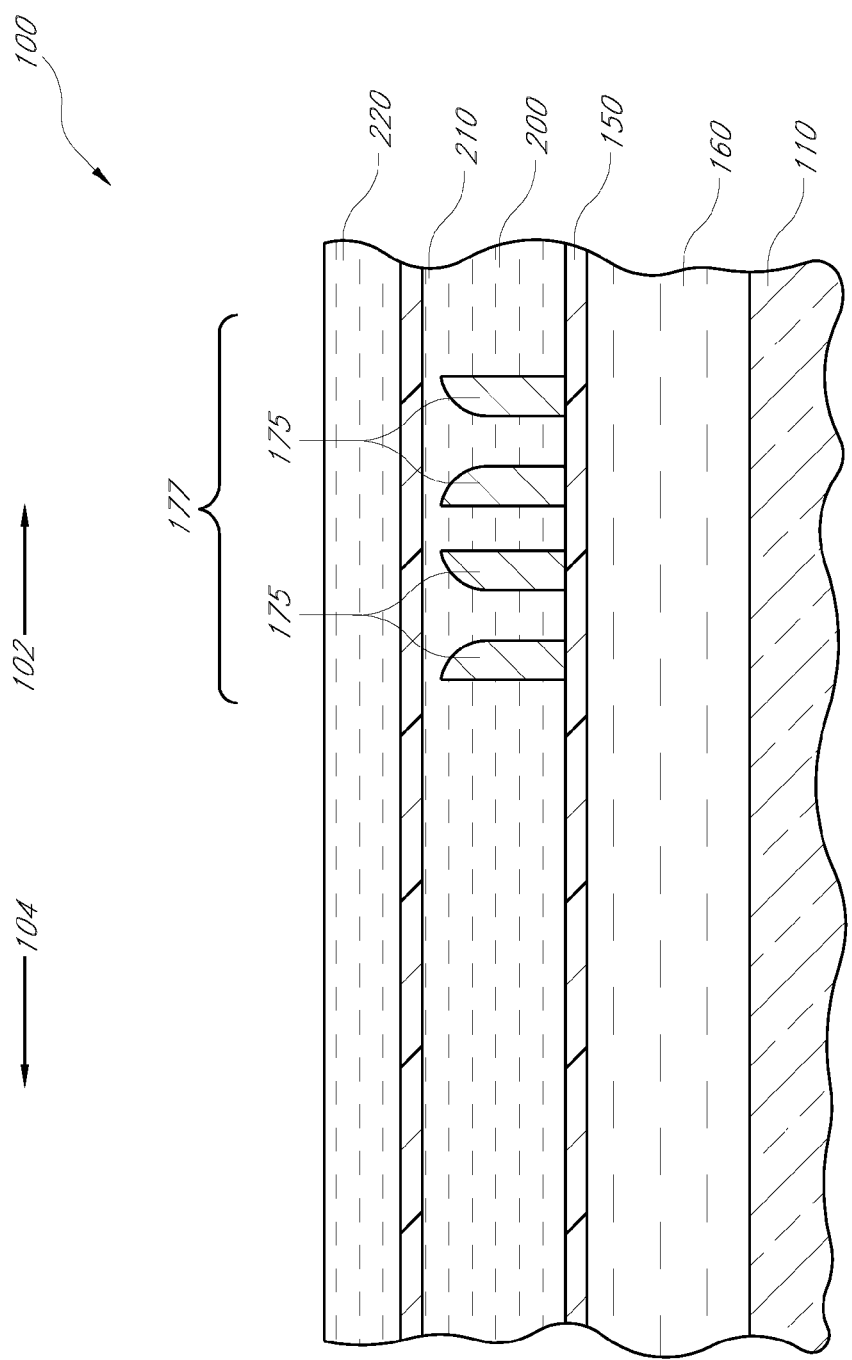
FIG. 10 is a schematic, cross-sectional side view of the partially formed memory device of FIG. 9 after surrounding the spacers with a removable material and forming a hard mask layer and a selectively definable layer over the spacers, in accordance with preferred embodiments of the invention.
Figure 11:
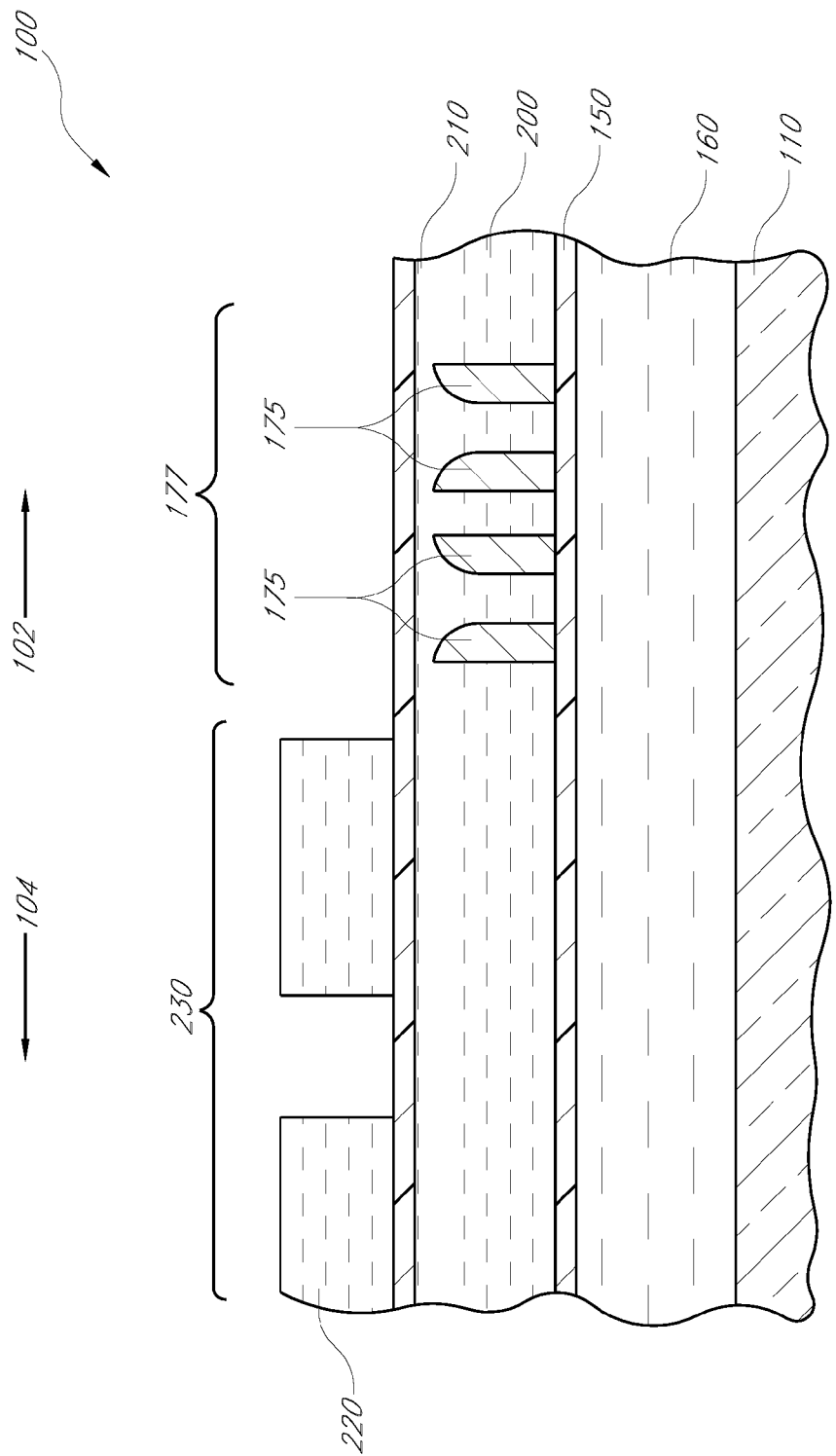
FIG. 11 is a schematic, cross-sectional side view of the partially formed memory device of FIG. 10 after forming a pattern in the selectively definable layer in the periphery of the memory device, in accordance with preferred embodiments of the invention.

Next, in a second phase of a method according to the preferred embodiments, a second pattern is formed at the periphery 104. To form this second pattern, the spacers 175 are protected and another photodefinable layer 220 is formed, as shown in FIG. 10, to allow for patterning of the second pattern at the periphery 104. The spacers 175 are protected by forming a protective layer 200 over the spacers 175. The protective layer 200 is preferably at least as tall as the spacers 175 and preferably about 100-500 nm thick and, more preferably, about 100-300 nm thick. A hard mask layer 210 is next preferably formed over the protective layer 200 to aid in transferring a pattern from the photodefinable layer 220 to the protective layer 200. Preferably, the hard mask layer 210 is about 40-80 nm thick and, more preferably, about 50-60 nm thick.

The protective layer 200 is preferably formed of a material that is readily removed selectively relative to the spacers 175. For example, the protective layer 200 can be formed of a photoresist, and may be the same or a different photoresist from that used to form the photodefinable layer 120 (FIGS. 2-5), which can be the same or a different material from than used to form the photodefinable layer 220 (FIG. 10). More preferably, the protective layer 200 is formed of amorphous carbon, which can be etched with excellent selectivity relative to the spacers 175.

In other embodiments where the protective layer 200 is formed of a material that can be selectively etched relative to both the spacers 175 and the photodefinable layer 220, the hard mask layer 210 can be omitted. For example, the protective layer 200 can be formed of a bottom anti-reflective coating (BARC) and a photoresist can be formed directly above the BARC. The spacers 175 can be formed of a material which allows good etch selectivity to the BARC, including silicon nitrides or oxides.

While it can be patterned using any photolithographic technique, the photodefinable layer 220 is preferably patterned using the same photolithographic technique used to pattern the photodefinable layer 120. Thus, with reference to FIG. 11, a pattern 230 is formed in the photodefinable layer 220. While the pattern 177 preferably has a pitch or resolution smaller than the minimum pitch or resolution of the photolithographic technique, the pattern 230 preferably has a pitch or resolution equal to or greater than the minimum pitch or resolution of the photolithographic technique. It will be appreciated that the pattern 230 at the periphery 104 can be used to form landing pads, transistors, local interconnects etc. It will also be appreciated that, while illustrated laterally separated from the pattern 177, the pattern 230 can also overlap the pattern 177. Thus, the use of different reference numerals (177 and 230) for these patterns indicates that they were originally formed in different steps.

Figure 12:
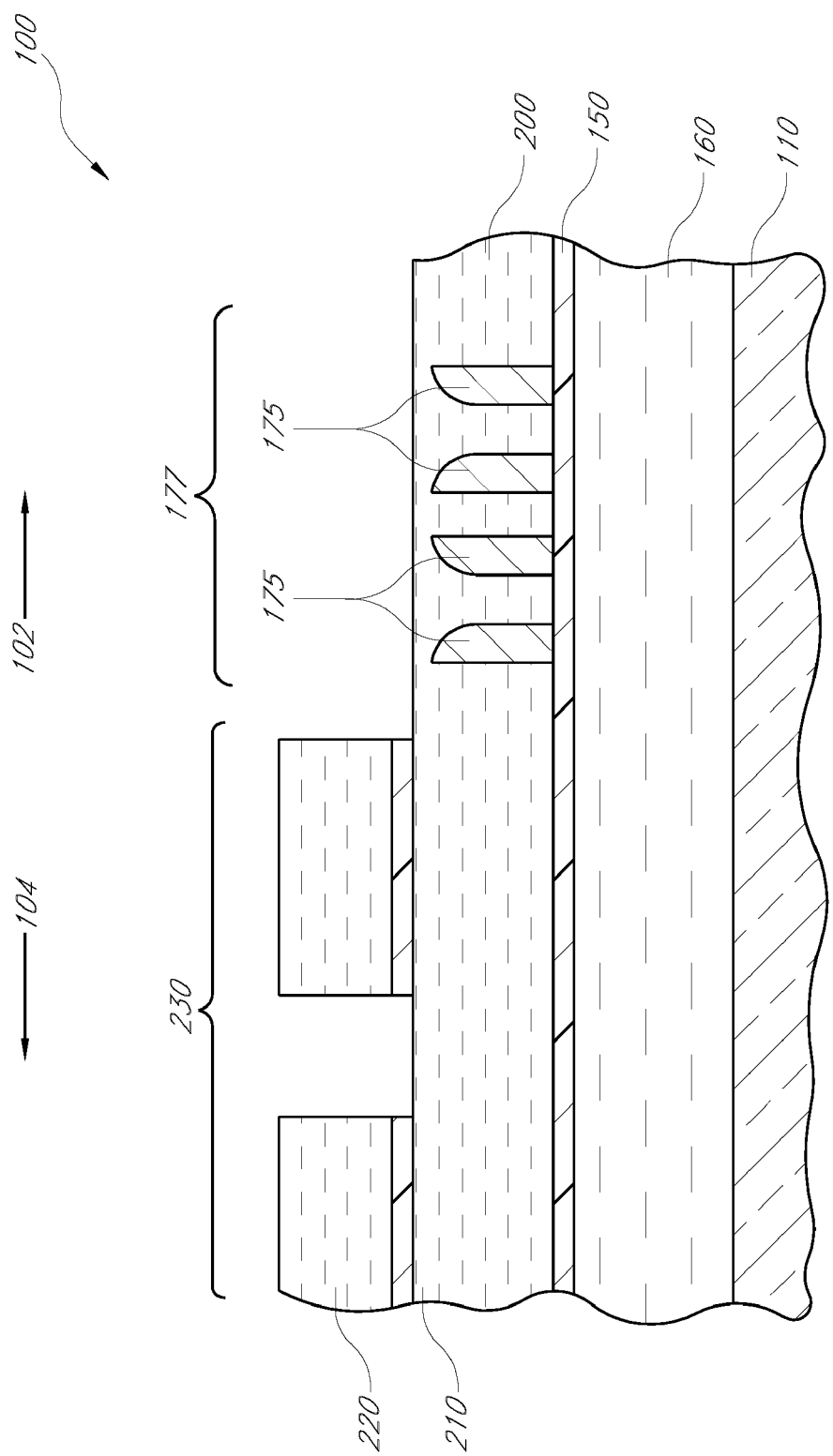
FIG. 12 is a schematic, cross-sectional side view of the partially formed memory device of FIG. 11 after etching through the top hard mask layer, in accordance with preferred embodiments of the invention.
Figure 13:
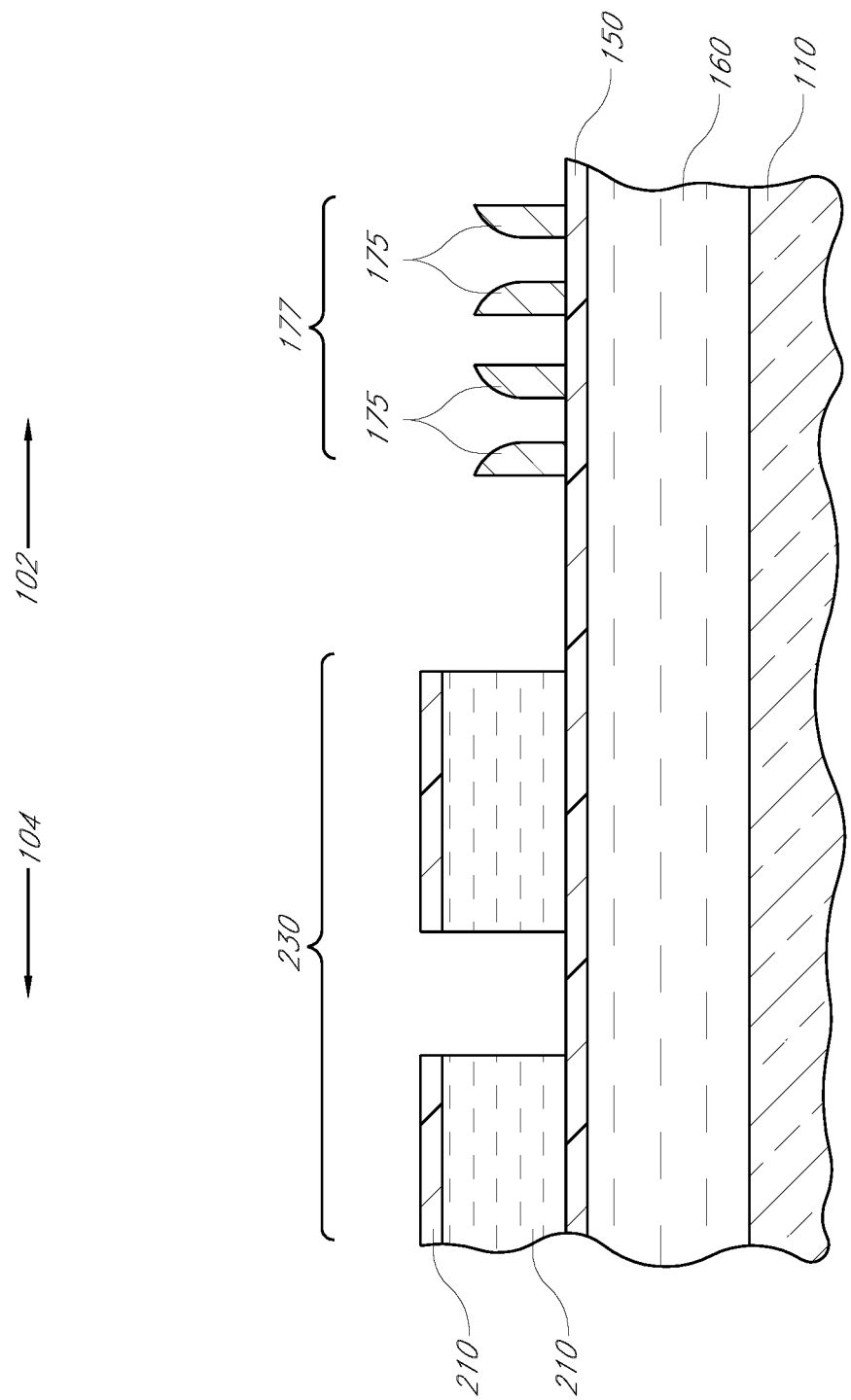
FIG. 13 is a schematic, cross-sectional side view of the partially formed memory device of FIG. 12 after transferring the pattern from the selectively definable layer to the same level as the spacers, in accordance with preferred embodiments of the invention.

The pattern 230 is then transferred to the same level as the pattern 177 of spacers 175. As shown in FIG. 12, the hard mask layer 210 is selectively etched relative to the photodefinable layer 220, preferably using an anisotropic etch such as a fluorocarbon plasma etch. Alternatively, a wet (isotropic) etch may also be suitable for the hard mask layer 210 is appropriately thin. The pattern 230 is then transferred to the protective layer 200 by another anisotropic etch, such as an etch with a $SO_2$-containing plasma, as shown in FIG. 13. Because the hardmask layer 210 overlying the spacers 175 has previously been removed, this etch also removes the protective layer 200 around the spacers 175, thereby leaving those spacers 175 exposed.

Figure 14:
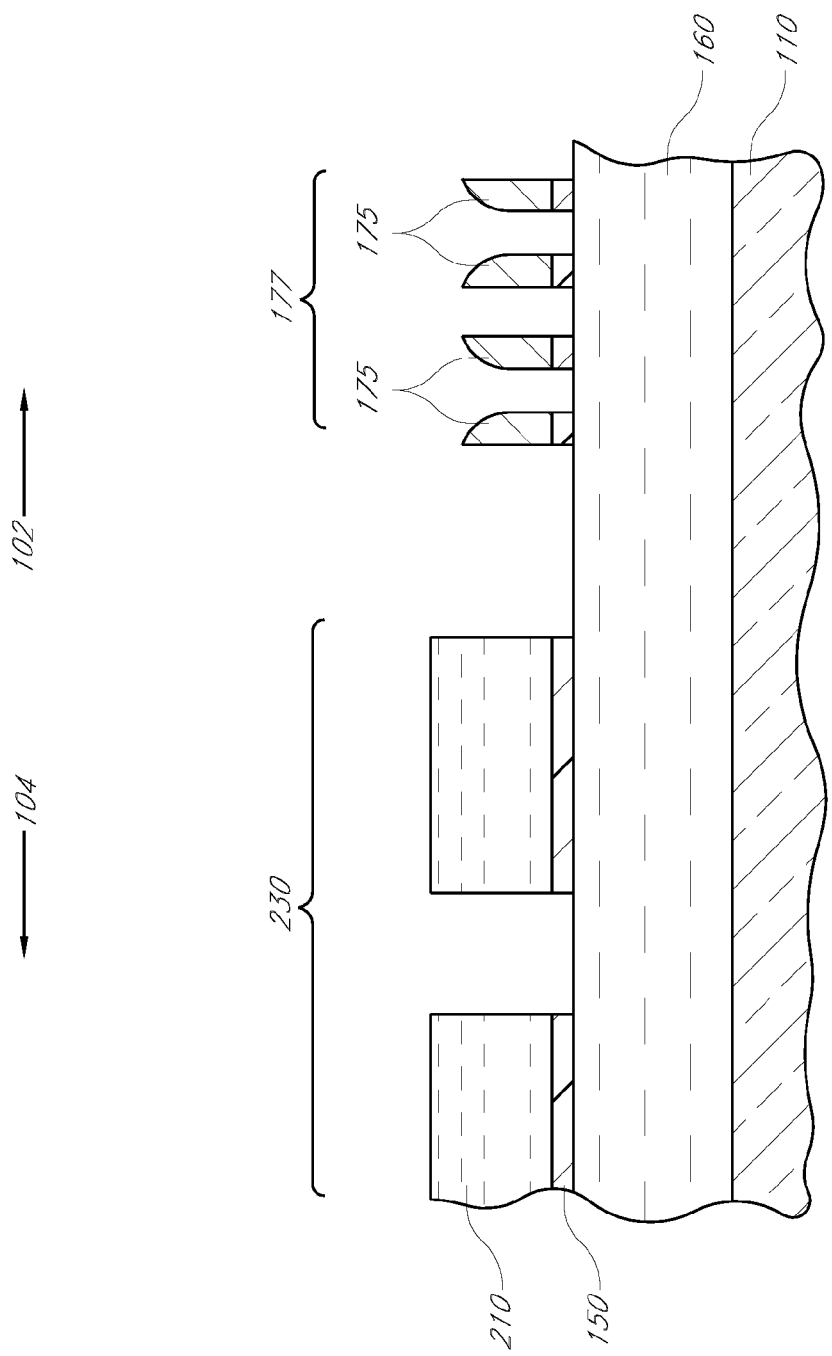
FIG. 14 is a schematic, cross-sectional side view of the partially formed memory device of FIG. 13 after etching the pattern in the periphery and the spacer pattern in the array into an underlying hard mask layer, in accordance with preferred embodiments of the invention.
Figure 15:
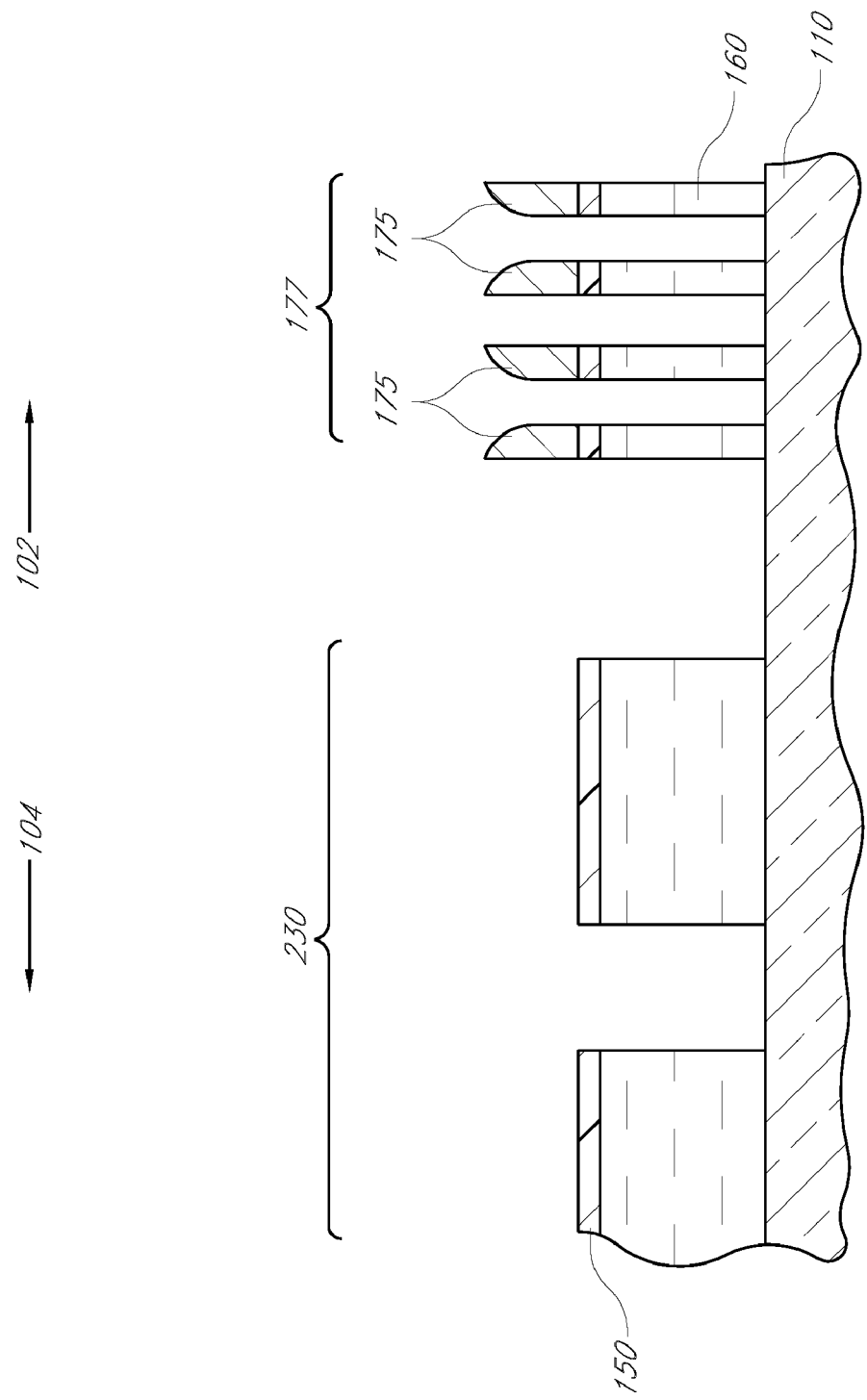
FIG. 15 is a schematic, cross-sectional side view of the partially formed memory device of FIG. 14 after transferring the pattern in the periphery and the spacer pattern in the array together to a primary mask layer, in accordance with preferred embodiments of the invention.

With reference to FIGS. 14 and 15, the patterns 177 and 230 are then transferred down to the primary mask layer 160, which preferably comprises a material having good etch selectivity to the substrate 110, and vice versa, to allow the patterns 177 and 230 to be simultaneously transferred to the substrate 110. Thus, the patterns 177 and 230 form a mixed pattern in the primary mask layer 160.

To transfer to the patterns 177 and 230, the hard mask layer 150 overlying the primary mask layer 160 is first etched (FIG. 14). The hard mask layer 150 is preferably anisotropically etched, preferably using a fluorocarbon plasma. Alternatively, an isotropic etch may be used if the hard mask layer 150 is relatively thin.

The primary mask layer 160 is then anisotropically etched, preferably using a $SO_2$-containing plasma, which can simultaneously remove the photodefinable layer 200 (FIG. 15). As noted above, the $SO_2$-containing plasma has excellent selectivity for the amorphous carbon of the primary mask layer 160 relative to the hard mask layer 150. Thus, a thick enough mask can be formed in the primary mask layer 160 to later effectively transfer the mask pattern to the substrate 110 using conventional etch chemistries and without wearing away the primary mask layer 160 before the pattern transfer is complete.

Figure 16:
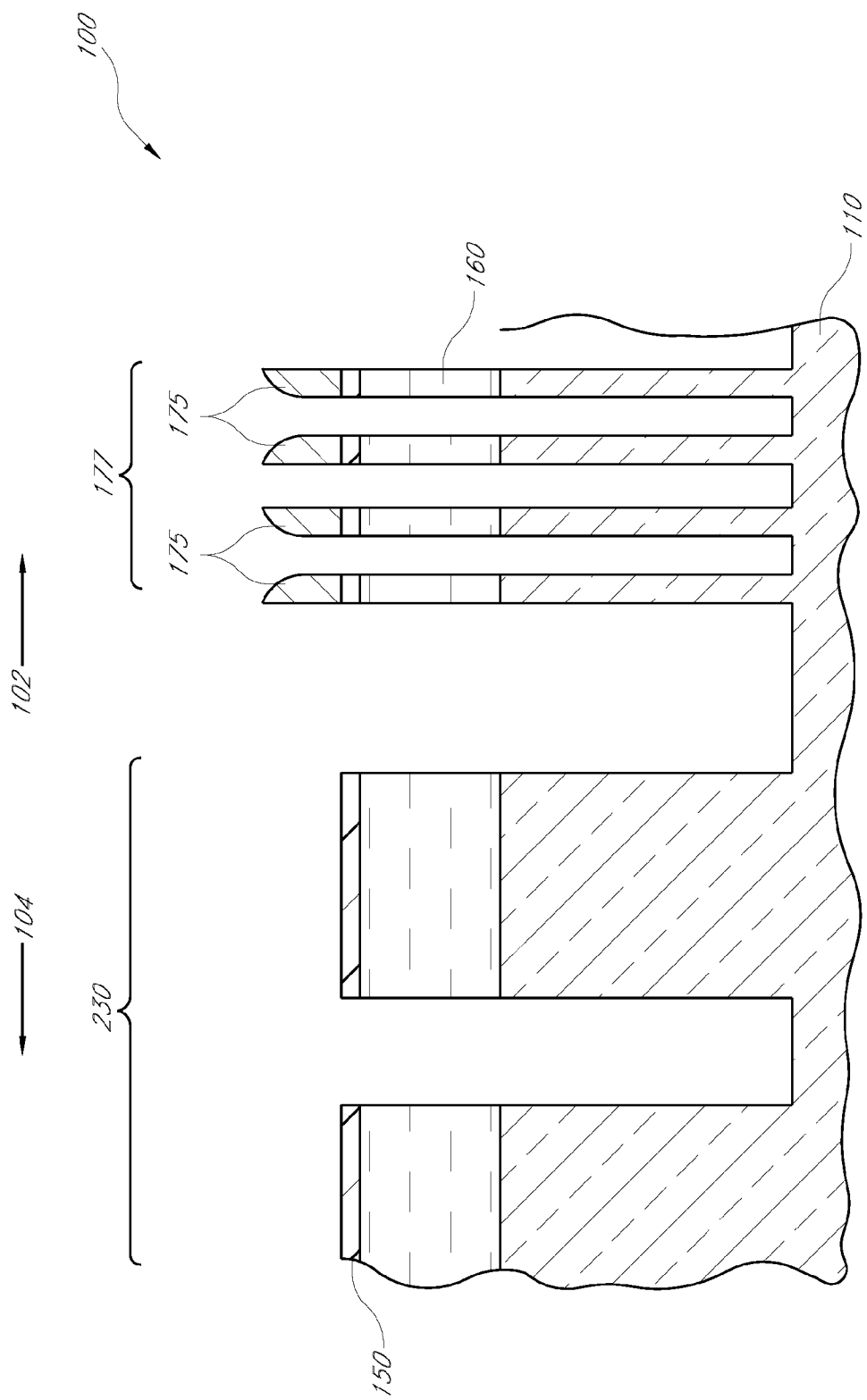
FIG. 16 is a schematic, cross-sectional side view of the partially formed memory device of FIG. 15 after transferring the periphery pattern and the spacer pattern to the underlying substrate, in accordance with preferred embodiments of the invention.

Having both been transferred to the primary mask layer 160, the patterns 177 and 230 can then be transferred to the substrate 110 using the layer 160 as a mask, as illustrated in FIG. 16. Given the disparate materials typically used for the primary mask layer 160 and the substrate 110 (e.g., amorphous carbon and silicon or silicon compounds, respectively), the pattern transfer can be readily accomplished using conventional etches appropriate for the material or materials comprising the substrate 110. For example, a fluorocarbon etch comprising $CF_4$, $CHF_3$ and/or $NF_3$ containing plasma can be used to etch silicon nitride, a fluorocarbon etch comprising $CF_4$, $CHF_3$, $CH_2F_2$ and/or $C_4F_8$ containing plasma can be used to etch silicon oxide and a HBr, $Cl_2$, $NF_3$, $SF_6$ and/or $CF_4$ containing plasma etch can be used to etch silicon. In addition, the skilled artisan can readily determine suitable etch chemistries for other substrate materials, such as conductors, including aluminum, transition metals, and transition metal nitrides. For example, an aluminum substrate can be etched using a fluorocarbon etch.

It will be appreciated that where the substrate 110 comprises layers of different materials, a succession of different chemistries, preferably dry-etch chemistries, can be used to successively etch through these different layers. It will also be appreciated that, depending upon the chemistry or chemistries used, the spacers 175 and the hard mask layer 150 may be etched. Amorphous carbon of the primary mask layer 160, however, advantageously offers excellent resistance to conventional etch chemistries, especially those used for etching silicon-containing materials. Thus, the primary mask layer 160 can effectively be used as a mask for etching through a plurality of substrate layers, or for forming high aspect ratio trenches. In addition, the pitch doubled pattern 177 and the pattern 230 formed by conventional lithography can simultaneously be transferred to the substrate 110, or each individual layer of the substrate 110, in a single etch step.

Figure 17A:
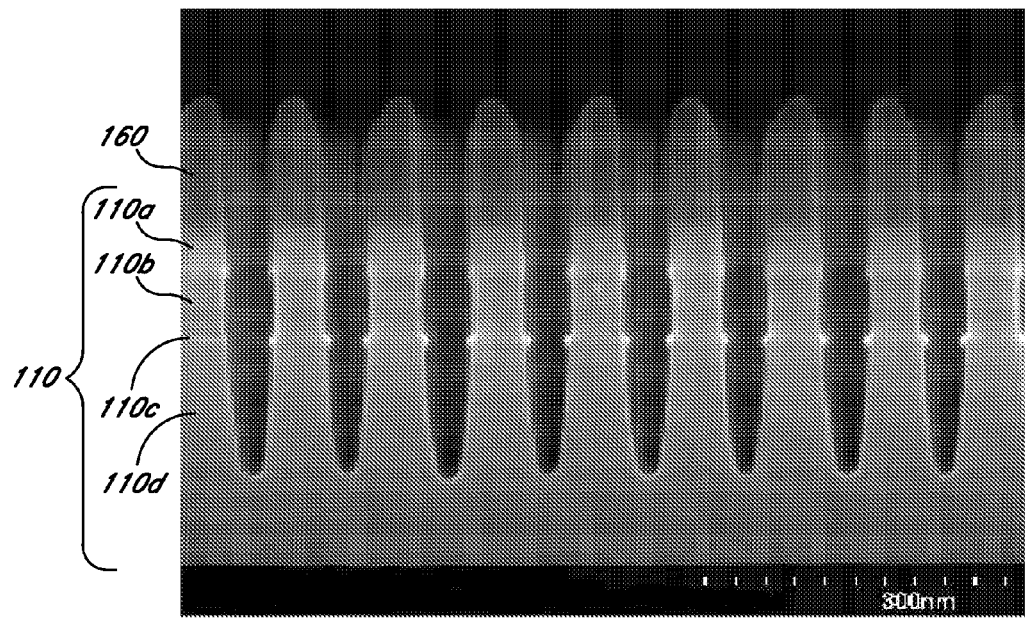
FIGS. 17A and 17B are micrographs, as viewed through a scanning electron microscope, of a pattern etched into the array and the periphery, respectively, of a partially formed memory device, formed in accordance with preferred embodiments of the invention.
Figure 17B:
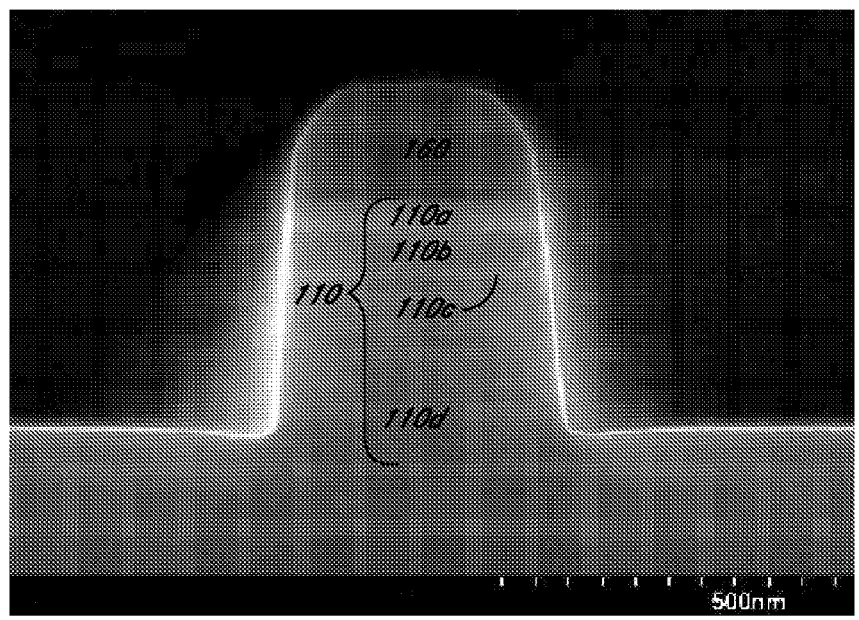

FIGS. 17A and 17B show the resultant structure. FIG. 17A shows the array portion of the integrated circuit 100, while FIG. 17B shows the periphery of the integrated circuit 100 (FIGS. 2-16). As noted above, the substrate 110 can be any layer of material or materials that the patterns 177 and 230 are etched into. The composition of the substrate 110 can depend upon, e.g., the electrical device to be formed. Thus, in FIGS. 17A and 17B, the substrate 110 comprises a $Si_3N_4$ layer 110a, a polysilicon layer 110b, a $SiO_2$ layer 110c and a silicon layer 110d. Such an arrangement of layers can be advantageously used in the formation of, e.g., transistors.

Note that the etched surfaces exhibit exceptionally low edge roughness. In addition, the trenches formed in the array show excellent uniformity, even at the low 100 nm pitch pictured. Advantageously, these results are achieved while also forming well-defined and smooth lines in the periphery, as illustrated in FIG. 17B.

It will be appreciated that the formation of patterns according to the preferred embodiments offers numerous advantages. For example, because multiple patterns, with different size features, can be consolidated on a single final mask layer before being transferred to a substrate, overlapping patterns can easily be transferred to the substrate. Thus, pitch-doubled features and features formed by conventional photolithography can easily be formed connected to each other. Moreover, as evident in FIGS. 17A and 17B, exceptionally small features can be formed, while at the same time achieving exceptional and unexpectedly low line edge roughness. While not limited by theory, it is believed that such low line edge roughness is the result of the use of the layers 140 and 160. Forming the spacers 175 and performing multiple anisotropic etches to transfer the patterns 177 and 230 from the level of the temporary layer 140 to the primary mask layer 160 and then to the substrate 110 are believed to beneficially smooth the surfaces of the features forming the patterns 177 and 230. Moreover, the preferred amorphous carbon etch chemistries disclosed herein allow the use of thin hard mask layers, such as the layers 130 and 150, relative to the depth that underlying amorphous carbon layers, such as the layers 140 and 160, are etched. This advantageously reduces demands on the identity of layers (e.g., photoresist layers) overlying the hard mask layers and also reduces demands on the chemistries used to etch the hard mask layers while at the same time ensuring that the primary mask layers form thick enough masks to withstand subsequent substrate etches.

It will also be appreciated that various modifications of the illustrated process flow are possible. For example, pitch multiplied patterns typically formed closed loops, since the patterns are formed by spacers that surround a mandrel. Consequently, where the pitch multiplied pattern is used to form conductive lines, additional processing steps are preferably used to cut off the ends of these loops, so that each loop forms two individual, non-connected lines.

Also, while the composition of the various layers discussed herein is chosen based upon consideration of etch chemistries and process conditions, the various hardmask layers are preferably each formed of the same material, as are the primary mask layers. Advantageously, such an arrangement reduces processing complexity.

In addition, the pitch of the pattern 177 can be more than doubled. For example, the pattern 177 can be further pitch multiplied by forming spacers around the spacers 175, then removing the spacers 175, then forming spacers around the spacers that were formerly around the spacers the 175, and so on. An exemplary method for further pitch multiplication is discussed in U.S. Pat. No. 5,328,810 to Lowrey et al. In addition, while the preferred embodiments can advantageously be applied to formed patterns having both pitch multiplied and conventionally photolithographically defined features, the patterns 177 and 230 can both be pitch multiplied or can have different degrees of pitch multiplication.

Moreover, more than two patterns 177 and 230 can be consolidated on the primary mask layer 160 if desired. In such cases, additional mask layers can be deposited between the layers 140 and 160. For example, the patterns 177 and 230 can be transferred to an additional mask layer overlying the hard mask layer 150 and then the sequence of steps illustrated in FIGS. 10-16 can be performed to protect the patterns 77 and 230, to form the new pattern in an overlying photodefinable layer and to transfer the patterns to the substrate 110. The additional mask layer preferably comprises a material that can be selectively etched relative to the hard mask layer 150 and a protective layer that surrounds the patterns 177 and 230 after being transferred to the additional mask layer.

Also, while "processing" through the various mask layers preferably involve etching an underlying layer, processing through the mask layers can involve subjecting layers underlying the mask layers to any semiconductor fabrication process. For example, processing can involve ion implantation, diffusion doping, depositing, or wet etching, etc. through the mask layers and onto underlying layers. In addition, the mask layers can be used as a stop or barrier for chemical mechanical polishing (CMP) or CMP can be performed on the mask layers to allow for both planarizing of the mask layers and etching of the underlying layers, Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for integrated circuit fabrication, comprising:
providing a substrate, wherein a primary masking layer overlies the substrate, wherein a first hard mask layer overlies the primary mask layer, and wherein a second hard mask layer overlies the first hard mask layer;
providing a plurality of free-standing spacers over the second hard mask layer, wherein the free-standing spacers form a first pattern;
transferring the first pattern to the second hard mask layer;
forming a second pattern in a masking material over the substrate;
transferring the second pattern to the second hard mask layer to form a consolidated pattern comprising the first and the second patterns;
transferring the consolidated pattern to the first hard mask layer;
transferring the consolidated pattern to the primary masking layer; and
transferring the consolidated pattern to the substrate.

2. The method of claim 1, wherein transferring the first pattern to the second hard mask layer and transferring the second pattern to the second hard mask layer are performed simultaneously.

3. The method of claim 1, wherein transferring the consolidated pattern to the primary masking layer forms openings in the primary masking layer, wherein transferring the consolidated pattern to the substrate comprises etching the substrate through the openings.

4. The method of claim 1, wherein transferring the consolidated pattern to the primary masking layer forms openings in the primary masking layer, wherein transferring the consolidated pattern to the substrate comprises implanting ions in the substrate through the openings.

5. The method of claim 1, wherein transferring the consolidated pattern to the primary masking layer forms openings in the primary masking layer, wherein transferring the consolidated pattern to the substrate comprises doping the substrate through the openings.

6. The method of claim 1, wherein transferring the consolidated pattern to the primary masking layer forms openings in the primary masking layer, wherein transferring the consolidated pattern to the substrate comprises performing a deposition through the openings.

7. The method of claim 1, wherein transferring the consolidated pattern to the primary masking layer forms openings in the primary masking layer, wherein transferring the consolidated pattern to the substrate comprises performing a wet etch through the openings.

8. The method of claim 1, wherein providing the plurality of free-standing spacers comprises:
   patterning a temporary layer to form a plurality of temporary placeholders;
   blanket depositing spacer material over the placeholders;
   selectively removing spacer material from horizontal surfaces to form spacers on sidewalls of the placeholders; and
   selectively removing the placeholders to leave the spacers free-standing.

9. The method of claim 8, wherein patterning the temporary layer comprises:
   patterning a photoresist layer overlying the temporary layer; and
   transferring a pattern in the photoresist layer to the temporary layer.

10. The method of claim 9, wherein the temporary layer comprises a carbon material.

11. The method of claim 10, wherein the carbon material is amorphous carbon.

12. The method of claim 1, wherein forming the second pattern in the masking material comprises:
   depositing the masking material over and around the spacers;
   patterning the masking material to define the second pattern.

13. The method of claim 12, wherein the masking material is amorphous carbon.

14. The method of claim 12, wherein the masking material is BARC.

15. The method of claim 12, wherein the masking material is photoresist.

16. The method of claim 12, wherein forming the second pattern in the masking material further comprises:
   depositing a photoresist layer over the masking material; and
   patterning the photoresist layer to form a photoresist pattern,
   wherein patterning the masking material to define the second pattern comprises transferring the photoresist pattern to the masking material.

17. The method of claim 16, wherein patterning the photoresist layer comprises performing electron beam lithography.

18. The method of claim 16, wherein patterning the photoresist layer comprises performing photolithography with light having a wavelength chosen from the group consisting of 13.7 nm, 157 nm, 193 nm, 248 nm or 365 nm wavelength light.

19. A method for forming an integrated circuit, comprising:
   providing a first hard mask layer overlying a substrate;
   forming a first pattern defined by masking material over the first hard mask layer1 the first pattern comprising a plurality of neighboring closed loops;
   etching the first pattern into the first hard mask layer;
   forming a second pattern defined by masking material over the first hard mask layer after forming the first pattern;
   etching the second pattern into the first hard mask layer;
   forming a third pattern defined by masking material over the first hard mask layer after forming the second pattern;
   etching the third pattern into the first hard mask layer to form a combined pattern in the first hard mask layer, wherein the combined pattern combines the first, second and third patterns; and
   transferring the combined pattern to the substrate.

20. The method of claim 19, wherein etching the first pattern into the first hard mask layer and etching the second pattern into the first hard mask layer are performed simultaneously.

21. The method of claim 19, further comprising:
   providing a second hard mask layer directly under the first hard mask layer; and
   transferring the combined pattern into the second hard mask layer before transferring the combined pattern to the substrate.

22. The method of claim 21, further comprising:
   providing an amorphous carbon layer directly under the second hard mask layer; and
   transferring the combined pattern into the amorphous carbon layer before transferring the combined pattern to the substrate.

23. A method for forming an integrated circuit, comprising:
   providing a first hard mask layer overlying a substrate;
   forming a first pattern defined by masking material over the first hard mask layer;
   etching the first pattern into the first hard mask layer;
   forming a second pattern defined by masking material over the first hard mask layer after forming the first pattern;
   etching the second pattern into the first hard mask layer;
   forming a third pattern defined by masking material over the first hard mask layer after forming the second pattern;
   etching the third pattern into the first hard mask layer to form a combined pattern in the first hard mask layer, wherein the combined pattern combines the first, second and third patterns;
   transferring the combined pattern to the substrate,
   wherein etching the first pattern into the first hard mask layer and etching the second pattern into the first hard mask layer are performed simultaneously, and
   wherein forming the first pattern comprises performing pitch multiplication, wherein performing pitch multiplication comprises:
      providing a plurality of temporary placeholders;
      blanket depositing spacer material over the placeholders;
      anisotropically etching the spacer material to form spacers on sidewalls of the placeholders; and
      selectively etching the placeholders to leave a plurality of free-standing spacers, the free-standing spacers formed of the masking material defining the first pattern.

24. The method of claim 23, wherein forming the second pattern comprises patterning photoresist without pitch multiplication, the photoresist being the masking material defining the second pattern, wherein the spacers and the photoresist occupy a same vertical level.

25. The method of claim 19, wherein etching the first pattern into the first hard mask layer and etching the second pattern into the first hard mask layer are performed before forming the third pattern, wherein forming the third pattern comprises:
   depositing a protective material over the first hard mask layer; and
   patterning the protective material to form the third pattern.

26. The method of claim 23, wherein forming the second pattern comprises:
- depositing a protective material over and around the spacers;
- depositing photoresist over the protective material;
- photolithographically patterning the photoresist to form a photoresist pattern; and
- transferring the photoresist pattern to the protective material, the protective material being the masking material defining the second pattern.

27. The method of claim 26, wherein the protective material is amorphous carbon.

28. The method of claim 26, wherein the protective material is BARC.

29. The method of claim 26, wherein the protective material is photoresist.

30. A method for forming an integrated circuit, comprising:
- providing a first hard mask layer overlying a substrate;
- forming a first pattern defined by masking material over the first hard mask layer;
- etching the first pattern into the first hard mask layer;
- forming a second pattern defined by masking material over the first hard mask layer after forming the first pattern;
- etching the second pattern into the first hard mask layer;
- forming a third pattern defined by masking material over the first hard mask layer after forming the second pattern;
- etching the third pattern into the first hard mask layer to form a combined pattern in the first hard mask layer, wherein the combined pattern combines the first, second and third patterns;
- transferring the combined pattern to the substrate,
- wherein etching the first pattern into the first hard mask layer and etching the second pattern into the first hard mask layer are performed before forming the third pattern, wherein forming the third pattern comprises:
  - depositing a protective material over the first hard mask layer; and
  - patterning the protective material to form the third pattern, and wherein forming the third pattern further comprises:
  - depositing a photoresist on the protective material; and
  - photolithographically patterning the photoresist to form a photoresist pattern,
  - wherein patterning the protective material comprises transferring the photoresist pattern to the protective material, the protective material being the masking material defining the third pattern.

31. The method of claim 30, wherein the protective material is amorphous carbon.

32. The method of claim 30, wherein the protective material is BARC.

33. The method of claim 30, wherein the protective material is photoresist.

* * * * *

UNITED STATES PATENT AND TRADEMARK OFFICE
CERTIFICATE OF CORRECTION

PATENT NO. : 7,687,408 B2  Page 1 of 1
APPLICATION NO. : 11/683518
DATED : March 30, 2010
INVENTOR(S) : Mirzafer K. Abatchev et al.

It is certified that error appears in the above-identified patent and that said Letters Patent is hereby corrected as shown below:

In column 15, line 59, in Claim 19, delete "layer1" and insert -- layer, --, therefor.

Signed and Sealed this

First Day of June, 2010

David J. Kappos
*Director of the United States Patent and Trademark Office*